United States Patent
Agashe et al.

(10) Patent No.: US 12,412,292 B2
(45) Date of Patent: Sep. 9, 2025

(54) SYSTEM AND METHOD FOR BRIGHTFIELD INSPECTION OF CIRCULAR ROTATING WAFERS

(71) Applicant: SAMSUNG ELECTRONICS CO., LTD., Suwon-si (KR)

(72) Inventors: Shashank Shrikant Agashe, Bengaluru (IN); Gaurav Kumar, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 393 days.

(21) Appl. No.: 17/958,784

(22) Filed: Oct. 3, 2022

(65) Prior Publication Data
US 2023/0230266 A1  Jul. 20, 2023

(30) Foreign Application Priority Data
Jan. 19, 2022  (IN) .............................. 202241003016

(51) Int. Cl.
*G06T 7/557* (2017.01)
*G01N 21/95* (2006.01)
*H01L 21/66* (2006.01)

(52) U.S. Cl.
CPC ......... *G06T 7/557* (2017.01); *G01N 21/9501* (2013.01); *H01L 22/12* (2013.01); *G06T 2207/30148* (2013.01)

(58) Field of Classification Search
CPC ...... G06T 7/557; G01N 21/9501; H01L 22/12
See application file for complete search history.

(56) References Cited

U.S. PATENT DOCUMENTS

| | | |
|---|---|---|
| 7,102,743 B2 | 9/2006 | Tsuji et al. |
| 7,227,628 B1 | 6/2007 | Sullivan et al. |
| 7,308,367 B2 | 12/2007 | Steele et al. |
| 7,315,361 B2 | 1/2008 | Schramm et al. |
| 7,417,724 B1 | 8/2008 | Sullivan et al. |

(Continued)

FOREIGN PATENT DOCUMENTS

| | | |
|---|---|---|
| KR | 10-1602580 B1 | 3/2016 |
| TW | 200526949 A | 8/2005 |
| TW | 201100779 A1 | 1/2011 |

OTHER PUBLICATIONS

Anomaly Detection in Semiconductor Manufacturing—by Tiankai Chen, Pub. National University of Singapore, 2017 (Year: 2017).*

(Continued)

*Primary Examiner* — Gregory A Morse
*Assistant Examiner* — Ty Mitchell Beatty
(74) *Attorney, Agent, or Firm* — Sughrue Mion, PLLC

(57) ABSTRACT

Systems and methods for brightfield inspection of a circular rotating wafer are provided. A method includes: acquiring a plurality of images of a circular wafer, that is rotating, by using a plurality of line cameras; obtaining a plurality of synchronized images, based on the plurality of images, by synchronizing a motion of the circular wafer, that is rotating, with at least one line camera from among the plurality of line cameras; obtaining a single wafer map by integrating together the plurality of synchronized images; obtaining an in-focus image of the single wafer map while the circular wafer is moving; and performing brightfield inspection of the circular wafer based on the in-focus image of the single wafer map.

9 Claims, 34 Drawing Sheets

(56) References Cited

U.S. PATENT DOCUMENTS

| | | |
|---|---|---|
| 7,792,350 B2 | 9/2010 | Kiley et al. |
| 8,624,971 B2 | 1/2014 | Brown et al. |
| 8,885,918 B2 | 11/2014 | Amanullah et al. |
| 9,068,952 B2 | 6/2015 | Petrenko et al. |
| 9,891,177 B2 | 2/2018 | Vazhaeparambil et al. |
| 9,989,477 B2 | 6/2018 | Vaez-Iravani et al. |
| 10,215,712 B2 | 2/2019 | Wolters et al. |
| 10,334,241 B2 | 6/2019 | Duparre et al. |
| 10,488,348 B2 | 11/2019 | Romanovsky et al. |
| 2004/0061779 A1 | 4/2004 | Harless et al. |
| 2010/0188499 A1 | 7/2010 | Amanullah et al. |
| 2017/0061603 A1* | 3/2017 | Agashe ............... G06F 18/23 |
| 2017/0150082 A1 | 5/2017 | Ui |
| 2020/0202504 A1* | 6/2020 | Shchemelinin ......... G06T 7/001 |

OTHER PUBLICATIONS

TDI Primer High Sensitivity Line Scanning, Teledyne Dalsa, 2022, http://www.teledynedalsa.com/en/learn/knowledge-center/tdi-primer/, (4 pages total).

\* cited by examiner

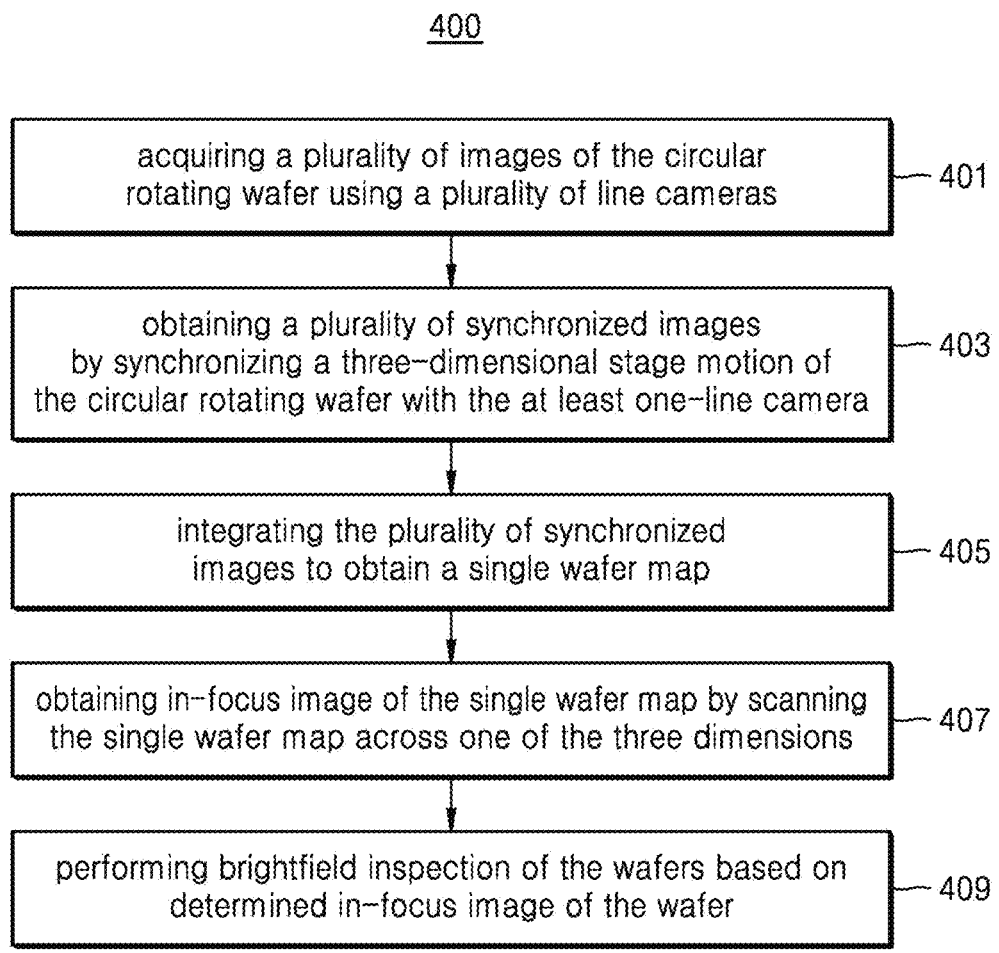

SYSTEM AND METHOD FOR BRIGHTFIELD INSPECTION OF CIRCULAR ROTATING WAFERS

CROSS-REFERENCE TO THE RELATED APPLICATION

This application is based on and claims priority under 35 U.S.C. § 119 to Indian Patent Application No. 202241003016, filed on Jan. 19, 2022, in the Indian Intellectual Property Office, the disclosure of which is incorporated by reference herein in its entirety.

BACKGROUND

Embodiments of the present disclosure generally relate to wafer inspection in semiconductor manufacturing, and more particularly, to a system and method for brightfield inspection of circular rotating wafers.

Current brightfield (BF) inspection of wafers in semiconductor manufacturing process is based on linear motion of a wafer in X, Y plane with a static camera. The wafer is aligned, i.e., its location in X, Y space is obtained by identifying alignment marks and a notch at the bottom of the wafer. FIG. 1 illustrates an existing method 100 for using time delay and integration (TDI) cameras to scan a wafer in rectangular swathes across the wafer. TDI camera 101a, 101b, ... 101n, where n is integer, is typically employed to scan the wafer 103 in rectangular swathes across the wafer. The speed of camera exposure is synchronized with the X, Y motion of a stage with ~nm level precision. The different swathe images are stitched together to obtain digital image of the wafer 103 and inspection mechanism are applied to identify defects. The following describes aspects involved in scanning the wafer 103 using the TDI cameras 101a, 101b, ... 101n:

Columns: ~8-16 k
Rows: ~256
Speed of line (row) readout: ~14-300 KHz
Dimension of each pixel: ~5-7 microns
Each pixel has to see same scene as the one above it
Integration across rows; final image read out from last line thereby increasing sensitivity
Typical magnification of the wafer 103: ~40 nm/pixel
Time taken for inspection of the whole wafer 103: ~153 minutes (~3.14*150*150/(300 KHz*40e-6*40e-6*16000))

Another approach is to rotate a wafer and perform the BF inspection. FIG. 2 depicts scanning (200) of circular rotating wafer 200, in accordance with background art. As shown in FIG. 2, a circular rotating wafer 203 with an anticlockwise rotation 207 is scanned by a TDI camera sensor 201. Each pixel in a first column 205 of the TDI camera sensor 201 observes a different scene. Hence, the pixels cannot be integrated across rows as in a normal TDI camera. Further, focus of the wafer has to be measured at each inspection point for in-focus image. Due to non-uniformities in thickness of a chuck and/or the wafer 203, a same focus (Z value) does not work at all points. Hence, there lies a need for a mechanism for brightfield inspection of a circular rotating wafer.

SUMMARY

According to an aspect of an example embodiment, a method for brightfield inspection of a circular wafer that is rotating, includes: acquiring a plurality of images of the circular wafer, that is rotating, by using a plurality of line cameras; obtaining a plurality of synchronized images, based on the plurality of images, by synchronizing a motion of the circular wafer, that is rotating, with at least one line camera from among the plurality of line cameras; obtaining a single wafer map by integrating together the plurality of synchronized images; obtaining an in-focus image of the single wafer map while the circular wafer is moving; and performing brightfield inspection of the circular wafer based on the in-focus image of the single wafer map.

Each of the plurality of images may include an array of pixels, and each of the plurality of line cameras includes pixel sensors.

The method may further include: matching the plurality of line cameras with a wafer curvature of the circular wafer by deactivating a predetermined number of the pixel sensors of the plurality of line cameras; and obtaining a plurality of active pixels from each of the plurality of images based on the wafer curvature.

The plurality of line cameras may be arranged in a spoke pattern, and the method may further include combining the plurality of images obtained from the plurality of line cameras that are arranged in the spoke pattern.

The synchronizing may include a time synchronization followed by a space synchronization.

The method further may further include determining a time period of rotation of the circular wafer by autocorrelating a plurality of signals obtained from the plurality of line cameras using an artificial recurrent neural network.

The method may further include: stacking the plurality of synchronized images; and converting the stacked plurality of synchronized images into Cartesian coordinates.

The obtaining the in-focus image may include: obtaining active pixels from the array of pixels by using a light modulator, wherein the light modulator includes a two-dimensional (2D) micro lens or a spatial light modulator (SLM); synchronizing the obtained active pixels by time synchronizing the obtained active pixels based on a rotation speed of the circular wafer, and space synchronizing the obtained active pixels based on locations of the active pixels in the array; and obtaining the in-focus image from the synchronized active pixels by activating and deactivating at least a part of the light modulator.

The obtaining the in-focus image of the single wafer map may include: repeating the following for each pixel of the single wafer map to obtain the in-focus image: setting a value of a standard deviation of a current pixel of the single wafer map to zero; determining the standard deviation of the current pixel with respect to a neighboring pixel; and determining if the standard deviation of the current pixel is greater than a standard deviation of the neighboring pixel; and storing the current pixel as a part of the in-focus image based on the standard deviation of the current pixel being greater than the standard deviation of the neighboring pixel.

According to an aspect of an example embodiment, a method for brightfield inspection of a circular wafer that is rotating, includes obtaining a plurality of images of the circular wafer using a circular sensor, wherein the circular sensor includes a plurality of arcs and each of the plurality of arcs includes pixel sensors; wherein the obtaining the plurality of images includes: obtaining intermediary images of at least one part of the circular wafer by observing the at least one part of the circular wafer by each of pixel sensors of each of the plurality of arcs; integrating the intermediary images together to obtain the plurality of images; obtaining a digital image of the circular wafer based on the plurality of images; and performing inspection of the circular wafer based on the obtained digital image of the circular wafer.

According to an aspect of an example embodiment, a system for brightfield inspection of a circular wafer that is rotating, includes: a plurality of line cameras configured to acquire a plurality of images of the circular wafer that is rotating; and at least one processor configured to implement: a synchronization module configured to obtain a plurality of synchronized images by synchronizing a motion of the circular wafer with at least one line camera from among the plurality of line cameras; an auto focus module configured to obtain a single wafer map by integrating together the plurality of synchronized images, and obtain an in-focus image of the single wafer map while the circular wafer is moving; and a brightfield inspection module configured to perform brightfield inspection of the circular wafer based on the in-focus image of the single wafer map.

Each of the plurality of images may include an array of pixels, and each of the plurality of line cameras include pixel sensors.

The synchronization module may be configured to: match the plurality of line cameras with a wafer curvature of the circular wafer by deactivating a predetermined number of the pixel sensors of the plurality of line cameras; and obtain active pixels from the array of pixels based on the wafer curvature.

The plurality of line cameras may be arranged in a spoke pattern, and the at least one processor may be configured to combine the plurality of images obtained from the plurality of line cameras that are arranged in the spoke pattern.

The synchronization module may be configured to obtain the plurality of synchronized images by performing a time synchronization followed by a space synchronization.

The synchronization module may be further configured to determine a time period of rotation of the circular wafer by auto-correlating a plurality of signals obtained from the plurality of line cameras using an artificial recurrent neural network.

The auto focus module may be further configured to: stack the plurality of synchronized images; and convert the stacked plurality of synchronized images to Cartesian coordinates.

The system may further include: a light modulator configured to obtain active pixels from the array of pixels, wherein the light modulator includes a two-dimensional (2D) micro lens or a spatial light modulator (SLM), wherein the synchronization module is configured to synchronize the obtained active pixels by time synchronizing the obtained active pixels based on a rotation speed of the circular wafer, and space synchronizing the obtained active pixels based on locations of the active pixels in the array, and the auto focus module is further configured for obtain the in-focus image from the synchronized active pixels by activating and deactivating at least a part of the light modulator.

The auto focus module may be configured to obtain the in-focus image of the single wafer map by: repeating the following for each pixel of the single wafer map to obtain the in-focus image: setting a value of a standard deviation of a current pixel of the single wafer map to zero; determining the standard deviation of the current pixel with respect to a neighboring pixel; and determining whether the standard deviation of the current pixel is greater than a standard deviation of the neighboring pixel; and storing the current pixel as a part of the in-focus image based on the standard deviation of the current pixel being greater than the standard deviation of the neighboring pixel.

According to an aspect of an example embodiment, a system for brightfield inspection of a circular wafer that is rotating, includes: a circular sensor including a plurality of arcs, and each of the plurality of arcs includes a plurality of pixel sensors, the circular sensor configured to obtain intermediary images of at least one part of the circular wafer by observing the at least one part of the circular wafer by each of the plurality of pixel sensors of each of the plurality of arcs; and at least one processor configured to implement: an image integration module configured to: obtain a plurality of images by integrating together the intermediary images obtained from each of the plurality of arcs, and obtain a digital image of the circular wafer based on the plurality of images; and a brightfield inspection module configured to perform inspection of the circular wafer based on the obtained digital image of the circular wafer.

BRIEF DESCRIPTION OF THE DRAWINGS

The above and other features, aspects, and advantages of embodiments of the present disclosure will become better understood when the following detailed description is read with reference to the accompanying drawings in which like characters represent like parts throughout the drawings, wherein:

FIG. 4 illustrates a flow diagram depicting a method for brightfield inspection of a circular rotating wafer, according to an embodiment of the present disclosure;

Figure 1:
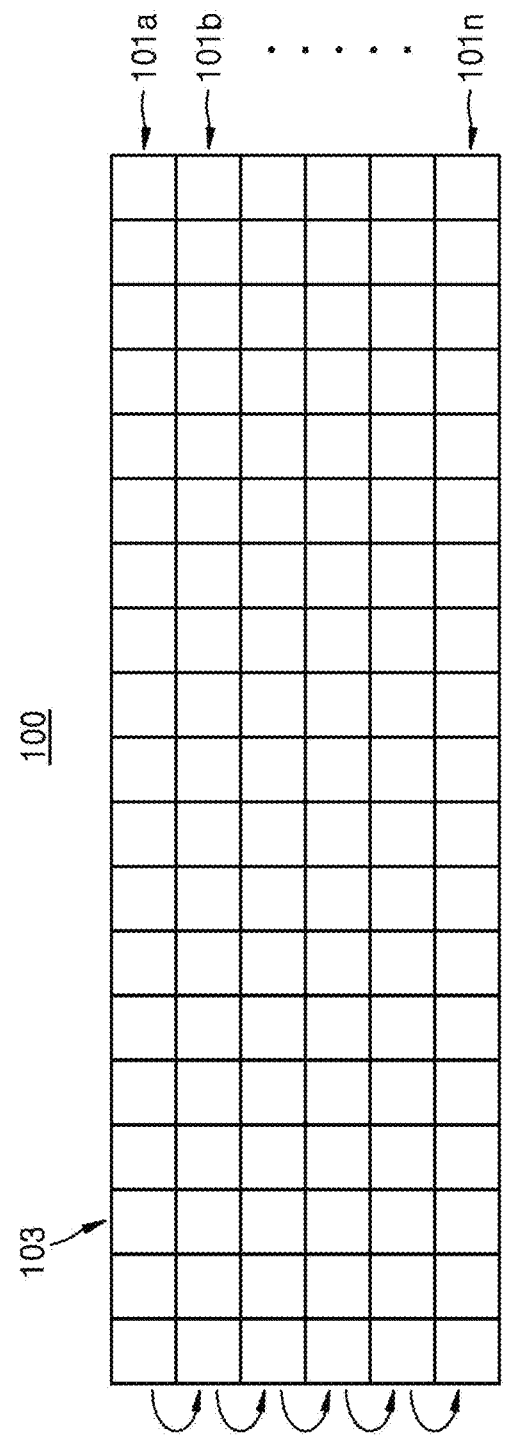
FIG. 1 illustrates an existing method for using a TDI camera to scan a wafer in rectangular swathes across the wafer.
Figure 2:
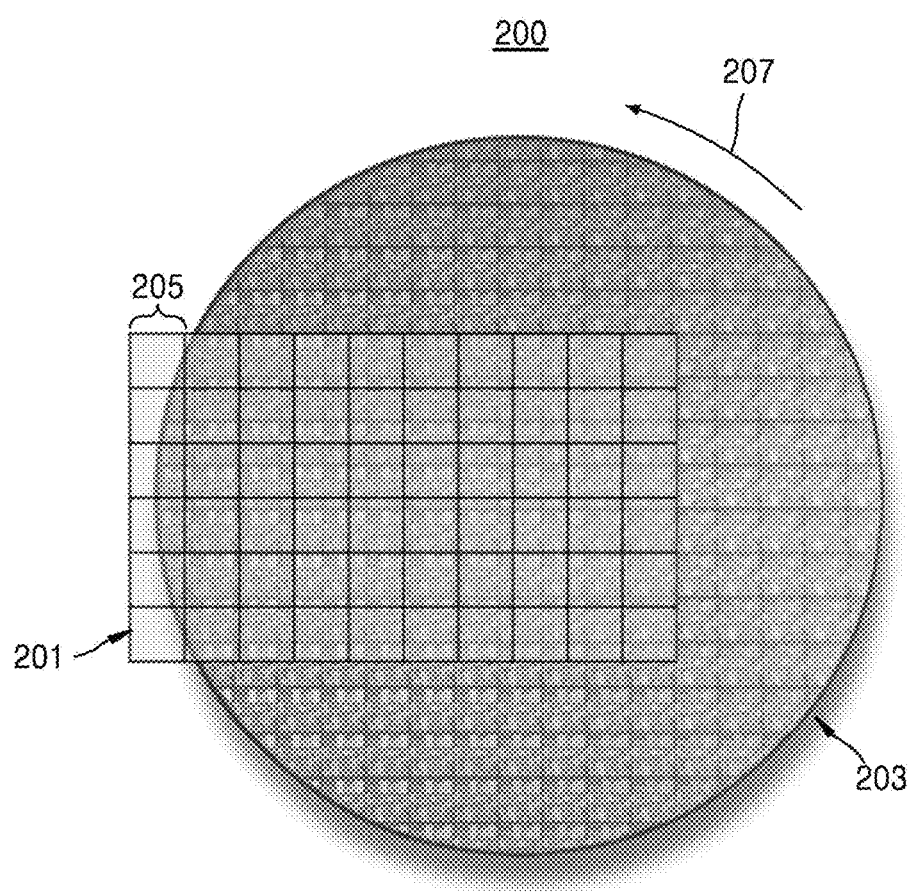
FIG. 2 depicts scanning of a circular rotating wafer, in accordance with background art.

Further, it will be appreciated that elements in the drawings are illustrated for simplicity and may not have necessarily been drawn to scale. For example, the flow charts illustrate the method in terms of the example steps involved to help to improve understanding of aspects of the present disclosure. Furthermore, in terms of the construction of the system, one or more components of the system may have been represented in the drawings by conventional symbols, and the drawings may show only those specific details that are pertinent to understanding the embodiments of the present disclosure so as not to obscure the drawings with details that will be readily apparent to those of ordinary skill in the art having benefit of the description herein.

DETAILED DESCRIPTION

It should be understood at the outset that, although illustrative implementations of embodiments of the present disclosure are described below, embodiments of the present disclosure may be implemented using any number of techniques, whether currently known or in existence. The present disclosure should in no way be limited to the illustrative implementations, drawings, and techniques described below, and embodiments of the present disclosure may be modified and may include their full scope of equivalents.

The term "some" as used herein is defined as "none, or one, or more than one, or all." Accordingly, the terms "none," "one," "more than one," "more than one, but not all" or "all" would all fall under the definition of "some." The term "some embodiments" may refer to no embodiments or to one embodiment or to several embodiments or to all embodiments. Accordingly, the term "some embodiments" is defined as meaning "no embodiment, or one embodiment, or more than one embodiment, or all embodiments."

The terminology and structure employed herein is for describing, teaching, and illuminating some embodiments and their specific features and elements and does not limit, restrict, or reduce the spirit and scope of the present disclosure.

More specifically, any terms used herein such as, but not limited to, "includes," "comprises," "has," and grammatical variants thereof do not specify an exact limitation or restriction and certainly do not exclude the possible addition of one or more features or elements, unless otherwise stated, and furthermore must not be taken to exclude the possible removal of one or more of the listed features and elements, unless otherwise stated with the limiting language "must comprise" or "needs to include."

Furthermore, the use of the terms "one or more" or "at least one" feature or element do not preclude there being none of that feature or element, unless otherwise specified by limiting language such as "there needs to be one or more . . ." or "one or more element is required."

Unless otherwise defined, all terms, and especially any technical and/or scientific terms, used herein may be taken to have the same meaning as commonly understood by one having an ordinary skill in the art.

Figure 3:
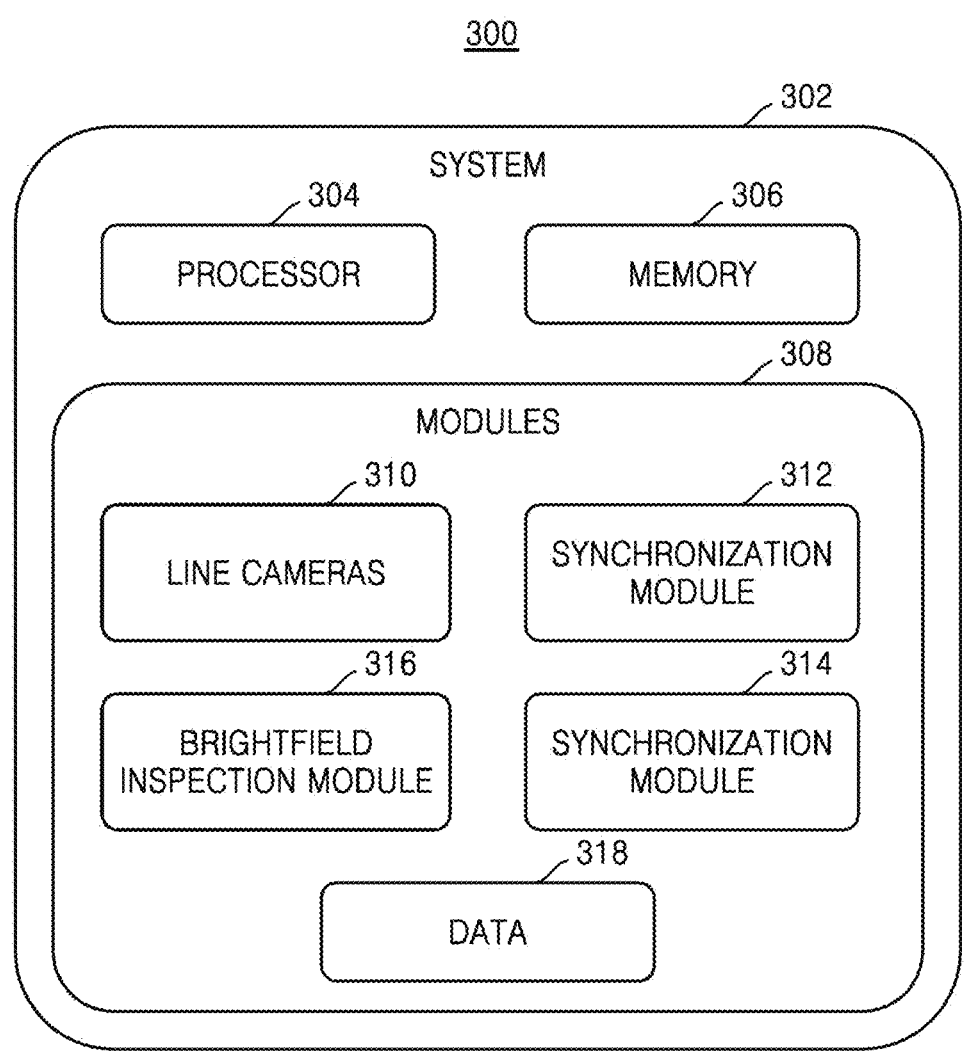
FIG. 3 illustrates a block diagram of a system for brightfield inspection of a circular rotating wafer, according to an embodiment of the present disclosure.

Embodiments of the present disclosure will be described below in detail with reference to the accompanying drawings. FIG. 3 illustrates a block diagram 300 of a system for brightfield inspection of a circular rotating wafer, according to an embodiment of the present disclosure. The system 302 includes a processor 304, a memory 306, modules 308, and data 318. The modules 308 may comprise a plurality of line cameras 310, a synchronization module 312, an auto focus module 314, and a brightfield inspection module 316. In an embodiment, the processor 304, the memory 306, the plurality of line cameras 310, the synchronization module 312, the auto focus module 314, the brightfield inspection module 316 and data 318 may be communicatively coupled to one another. At least one of the modules 308 may be implemented by an AI model. According to embodiments, the AI model (and/or the modules 308 implemented by the AI model) may be stored in memory (e.g., memory 306) as computer program code and the functions (e.g., one or more of the modules 308) associated with the AI model may be implemented by the processor 304 executing the computer program code.

The processor 304 may include one or a plurality of processors. At this time, one or a plurality of processors may be a general-purpose processor, such as a central processing unit (CPU), an application processor (AP), or the like, a graphics-only processing unit such as a graphics processing unit (GPU), a visual processing unit (VPU), and/or an AI-dedicated processor such as a neural processing unit (NPU).

A plurality of processors (e.g., the processor 304) controls the processing of the input data in accordance with a predefined operating rule or artificial intelligence (AI) model stored in the non-volatile memory or the volatile memory (e.g., the memory 306). The predefined operating rule or artificial intelligence model is provided through training or learning. Here, being provided through learning means that, by applying a learning technique to a plurality of learning data, a predefined operating rule or AI model of a desired characteristic is made. The learning may be performed on a device itself in which AI according to an embodiment is performed, and/or may be implemented through a separate server/system. The AI model may comprise or consist of a plurality of neural network layers. Each layer has a plurality of weight values and performs a layer operation through calculation of a previous layer and an operation of a plurality of weights. Examples of neural networks include, but are not limited to, convolutional neural network (CNN), deep neural network (DNN), recurrent neural network (RNN), restricted Boltzmann Machine (RBM), deep belief network (DBN), bidirectional recurrent deep neural network (BRDNN), generative adversarial networks (GAN), and deep Q-networks.

The learning technique is a method for training a predetermined target device (for example, a robot) using a plurality of learning data to cause, allow, or control the target device to make a determination or prediction. Examples of learning techniques include, but are not limited to, supervised learning, unsupervised learning, semi-supervised learning, and reinforcement learning.

As would be appreciated, the system 302, may be understood as one or more of a hardware, a software, a logic-based program, a configurable hardware, and the like. In an example, the processor 304 may be a single processing unit or a number of units, all of which could include multiple computing units. The processor 304 may be implemented as one or more microprocessors, microcomputers, microcontrollers, digital signal processors, central processing units, processor cores, multi-core processors, multiprocessors, state machines, logic circuitries, application-specific integrated circuits, field-programmable gate arrays, and/or any devices that manipulate signals based on operational instructions. Among other capabilities, the processor 304 may be configured to fetch and/or execute computer-readable instructions and/or data stored in the memory 306.

In an example, the memory 306 may include any non-transitory computer-readable medium known in the art including, for example, volatile memory, such as static random-access memory (SRAM) and/or dynamic random-access memory (DRAM), and/or non-volatile memory, such as read-only memory (ROM), erasable programmable ROM (EPROM), flash memory, hard disks, optical disks, and/or magnetic tapes. The memory 306 may include the data 318. The memory 306 serves, amongst other things, as a repository for storing data processed, received, and generated by one or more of the processor 304, and the modules 308.

The modules 308, amongst other things, may include routines, programs, objects, components, data structures, etc., which perform particular tasks or implement data types. The modules 308 may also be implemented as, signal processor(s), state machine(s), logic circuitries, and/or any other device or component that manipulate signals based on operational instructions. Further, the modules 308 may be implemented in hardware, as instructions executed by at least one processing unit (e.g., processor 304), or by a combination thereof. The processing unit may be a general-purpose processor that executes instructions to cause the general-purpose processor to perform operations or, the processing unit may be dedicated to performing the required functions. According to embodiments of the present disclosure, the modules 308 may be machine-readable instructions (software) which, when executed by a processor/processing unit (e.g., the processor 304), may perform any of the described functionalities.

In an embodiment, the plurality of line cameras 310 may be configured to acquire a plurality of images of the circular rotating wafer. Each of the plurality of line cameras may include a plurality of pixel sensors. Further, each of the plurality of images may comprise an array of pixels.

The synchronization module 312 may be configured to obtain a plurality of synchronized images by synchronizing a motion of the circular rotating wafer with at least one-line camera of the plurality of line cameras 310. The synchronization module 312 may be configured to synchronize the circular rotation motion of the stage with the plurality of line cameras 310. The synchronization includes a time synchronization followed by a space synchronization. The time synchronization may remove deformation by shifting pixels based on the rotation period. The space synchronization may allow for proper alignment of the pixel. This alignment may be constant for a given line camera offset irrespective of the wafer diameter. The synchronization module 312 may be configured to determine a time period of rotation of the circular rotating wafer by auto-correlating a plurality of signals obtained from the different line cameras 310 using an artificial recurrent neural network.

Further, the auto focus module 314 may be configured to integrate the plurality of synchronized images to obtain a single wafer map. The auto focus module 314 may include or be associated with a light modulator that is configured to obtain an active pixel from the array of pixels. The light modulator may include a two-dimensional (2D) micro lens or a spatial light modulator (SLM). The synchronization module 312 may be configured for synchronizing the obtained active pixel. The obtained active pixel may be time synchronized based on the rotation speed of the wafer and space synchronized based on the location of the pixel in the array. The auto focus module 316 may be configured for obtaining an in-focus image from the synchronized active pixel by activating and deactivating at least a part of the light modulator.

The auto focus module 314 may be configured to obtain the in-focus image of the single wafer map while the circular wafer is moving. The auto focus module 314 may be configured to stack the plurality of synchronized images and convert the stacked synchronized images to Cartesian coordinates. The auto focus module 314 may be configured to the obtain the in-focus image of the single wafer map by (a) setting a standard deviation of a current pixel of the single wafer map to zero, (b) determining a standard deviation of a small image section in the neighborhood of the current pixel including the current pixel, and (c) determining when the standard deviation is maximum for this image section across images taken at different Z heights and storing the corresponding value of current pixel as a part of the in-focus image. The auto focus module 314 may be configured to repeat the above steps (a)-(c) for each pixel of the map to obtaining the in-focus image.

Further, the brightfield inspection module 316 may be configured to perform brightfield inspection of the wafers based on the determined in-focus image of the wafer.

FIG. 4 illustrates a flow diagram 400 depicting a method for brightfield inspection of a circular rotating wafer, according to an embodiment of the present disclosure. The method 400 may include acquiring, at a step 401, a plurality of images of the circular rotating wafer using the plurality of line cameras 310. Each of the plurality of images comprises an array of pixels and each of plurality of line cameras 310 include a plurality of pixel sensors.

The method 400 may include obtaining, at a step 403, a plurality of synchronized images by synchronizing a motion of the circular rotating wafer with at least one-line camera of the plurality of line cameras 310. This step may be performed by the synchronization module 314. The synchronization includes a time synchronization followed by a space synchronization. The method may include determining a time period of rotation of the circular rotating wafer by auto-correlating a plurality of signals obtained from different line cameras using an artificial recurrent neural network. The method may include stacking the plurality of synchronized images and converting the stacked synchronized images to Cartesian coordinates.

The plurality of synchronized images may be added or stacked to enhance signal in an overlapping region after time and space synchronization.

Further, the method 400 may include integrating, at a step 405, the plurality of synchronized images to obtain a single wafer map. Further, multiple integrations can thus be performed to reduce noise and increase sensitivity multiple times. The method 400 may include obtaining, at a step 407, an in-focus image of the single wafer map while the circular wafer is moving. The method may include obtaining an active pixel(s) from the array of pixels by using a light modulator. The light modulator includes a 2D micro lens or spatial light modulator (SLM). The method may include synchronizing the obtained active pixels. The obtained active pixels are time synchronized based on the rotation speed of the wafer. The obtained active pixels are further space synchronized based on the location of the active pixels in the array. The method may include obtaining the in-focus image from the synchronized active pixels by activating and deactivating at least a part of the light modulator.

In another embodiment, the method for obtaining the in-focus image of the single wafer map may comprise (a) setting a standard deviation of a current pixel of the single wafer map to zero, (b) determining a standard deviation of the current pixel with respect to a neighboring pixel, and (c) determining whether the standard deviation of the current pixel is greater than a standard deviation of the neighboring pixel. The method may include storing the current pixel as a part of the in-focus image if the standard deviation of the at least one current pixel is greater than the standard deviation of the neighboring pixel. The method may further include repeating steps (a)-(c) for each pixel of the wafer map to obtain the in-focus image. These steps may be performed by the auto focus module 314.

Subsequently, after obtaining the in-focus image, the method 400 may include performing, at a step 409, brightfield inspection of the wafer based on the determined in-focus image of the wafer. This step may be performed by the brightfield inspection module 316.

Figure 5A:
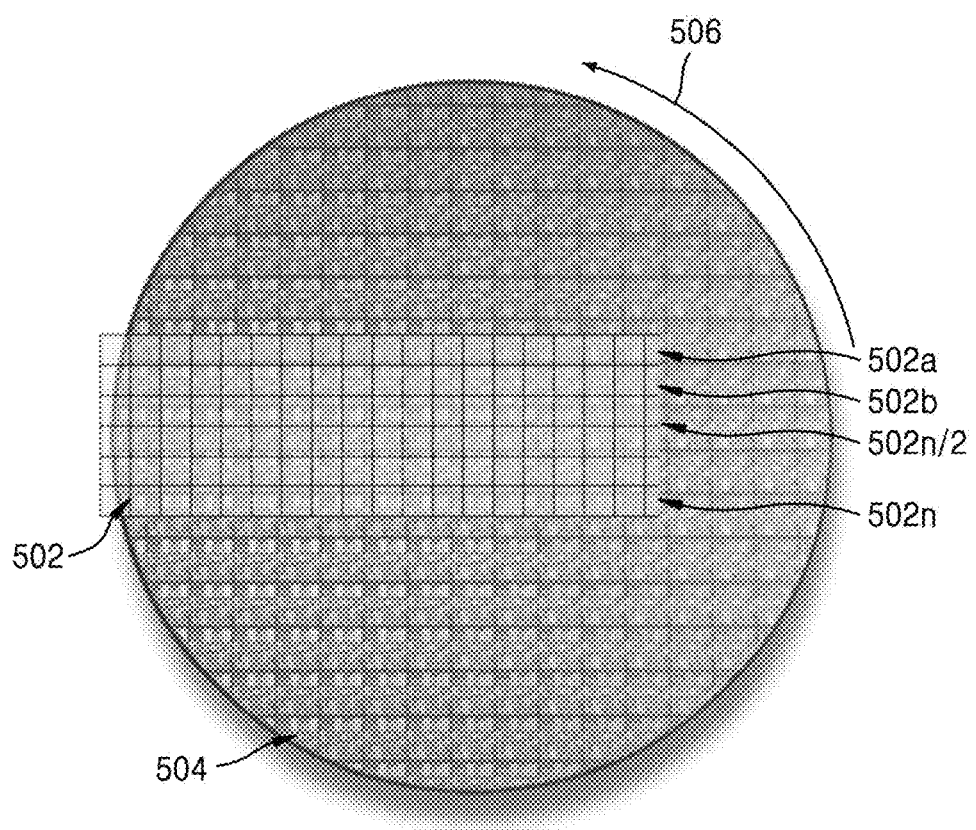
FIGS. 5A and 5B illustrate diagrams depicting a method for integrating a plurality of synchronized images to obtain a single wafer map, according to an embodiment of the present disclosure.
Figure 5B:
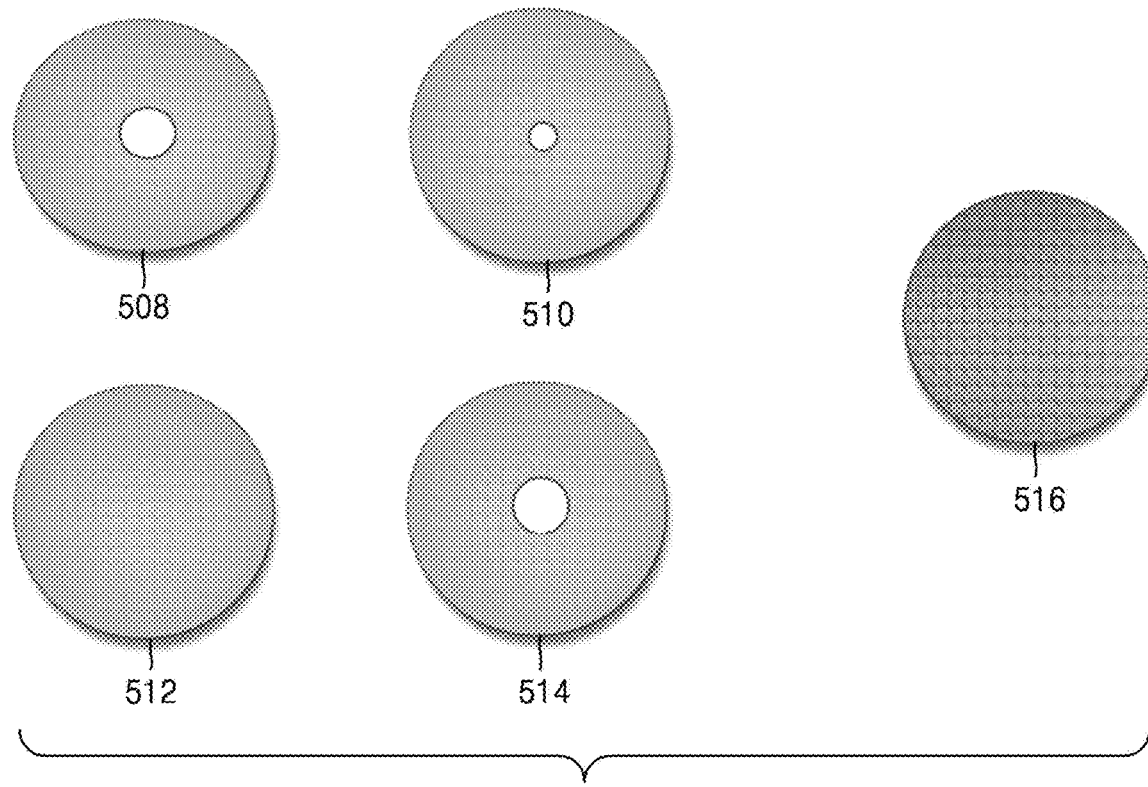

FIGS. 5A and 5B illustrate diagrams depicting a method for integrating the plurality of synchronized images to obtain a single wafer map, according to an embodiment of the present disclosure. In an implementation, the method may include scanning the rotating wafer 504 by a plurality of line sensors 502. The rotating wafer 504 with an anticlockwise rotation 506 is shown in the FIG. 5A. The plurality of line sensors 502 are present in a plurality of rows 502*a*, 502*b*, . . . 502*n*/2, . . . 502*n*, where n is an integer. In an embodiment, each row 502*a*, 502*b*, . . . 502*n*/2, . . . 502*n* of line sensors 502 may be considered as a separate line scan camera. The method may include adding images after the entire rotating wafer 504 is scanned at a same sensitivity. The method may include integrating a plurality of images 508, 510, 512 and 514 to obtain a single wafer map 516 as shown in the FIG. 5B. The images obtained by the plurality of line sensors 502 in the rows 502*a*, 502*b*, . . . 502*n*/2, . . . 502*n* are depicted as images 508, 510, 512 and 514, respectively. In other words, the images obtained by each of the line sensors 502 results in the wafer map 516. One of the line sensors 502 (e.g., corresponding to row 502*n*/2) that passes through the center of rotation (e.g., the center of the rotating wafer 504) may obtain the image 512 that does not contain any hole while the line sensors 512 that are separated from the center of rotation may obtain images that includes holes in their center since such line sensors 512 may not capture the middle sections of the rotating wafer 504. After performing time and space synchronization, the plurality of the images 508, 510, 512 and 514 can then be combined together to obtain the wafer map 516 for enhanced intensity. According to embodiments, the intensity may not be the same across an entirety of the wafer map 516, due to a varying diameter of a hole in the images 508, 510, 512 and 514 due to different lines.

Figure 6:
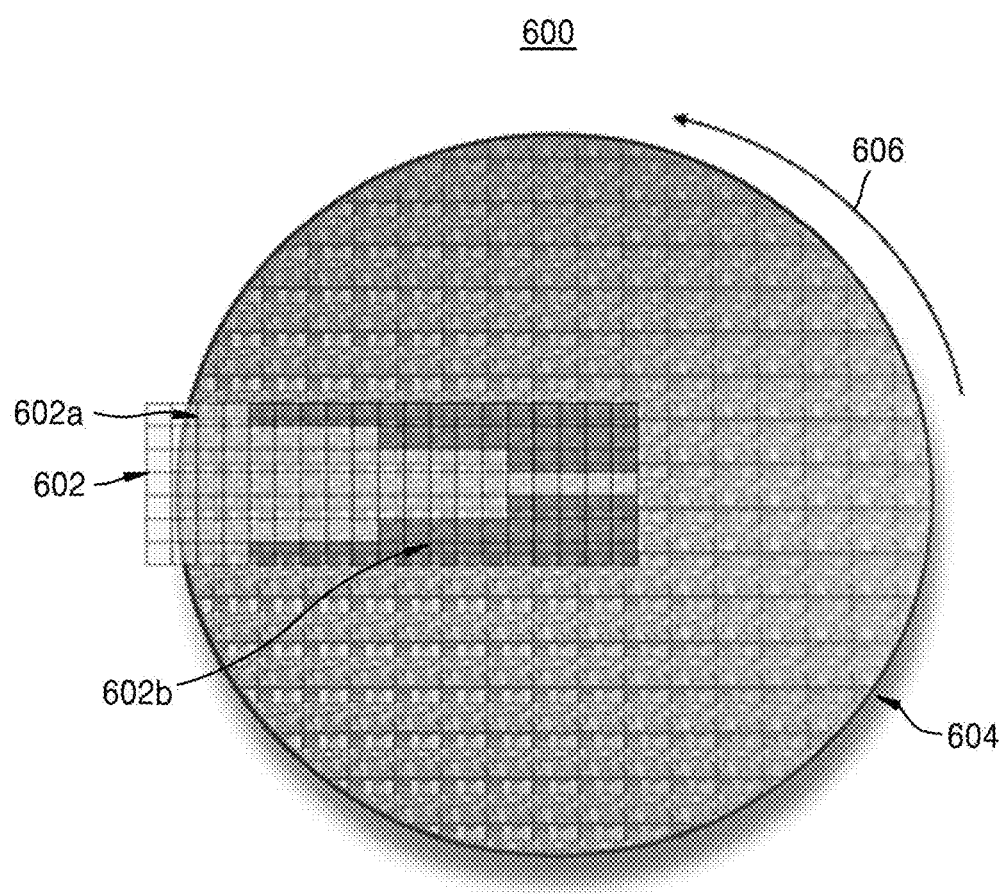
FIG. 6 illustrates a diagram depicting a method for obtaining a plurality of active pixels from an array of pixels, according to an embodiment of the present disclosure.

FIG. 6 illustrate a diagram 600 depicting a method for obtaining a plurality of active pixels from the array of pixels, according to an embodiment of the present disclosure. The method may include matching a curvature of a rotating waver 604 by deactivating a predetermined number of pixel sensors of each of the plurality of line cameras 602. The activated sensors are depicted as pixel sensors 602*a* and deactivated sensors are depicted as pixel sensors 602*b*. The rotating wafer 604 with an anticlockwise rotation 606 is shown in the FIG. 6. The method may include obtaining a plurality of active pixels corresponding to pixel sensors 602*a* from each of the plurality of the image based on the curvature of the rotating waver 604. This method may lead to reduced data for analysis while keeping sensitivity uniform. In other words, some of the pixels may be deactivated to give a pseudo cone shape as per the curvature of the wafer. After time and space synchronization when the wafer images from different line cameras are added together to form a wafer map, the intensity may be more uniform.

Figure 7:
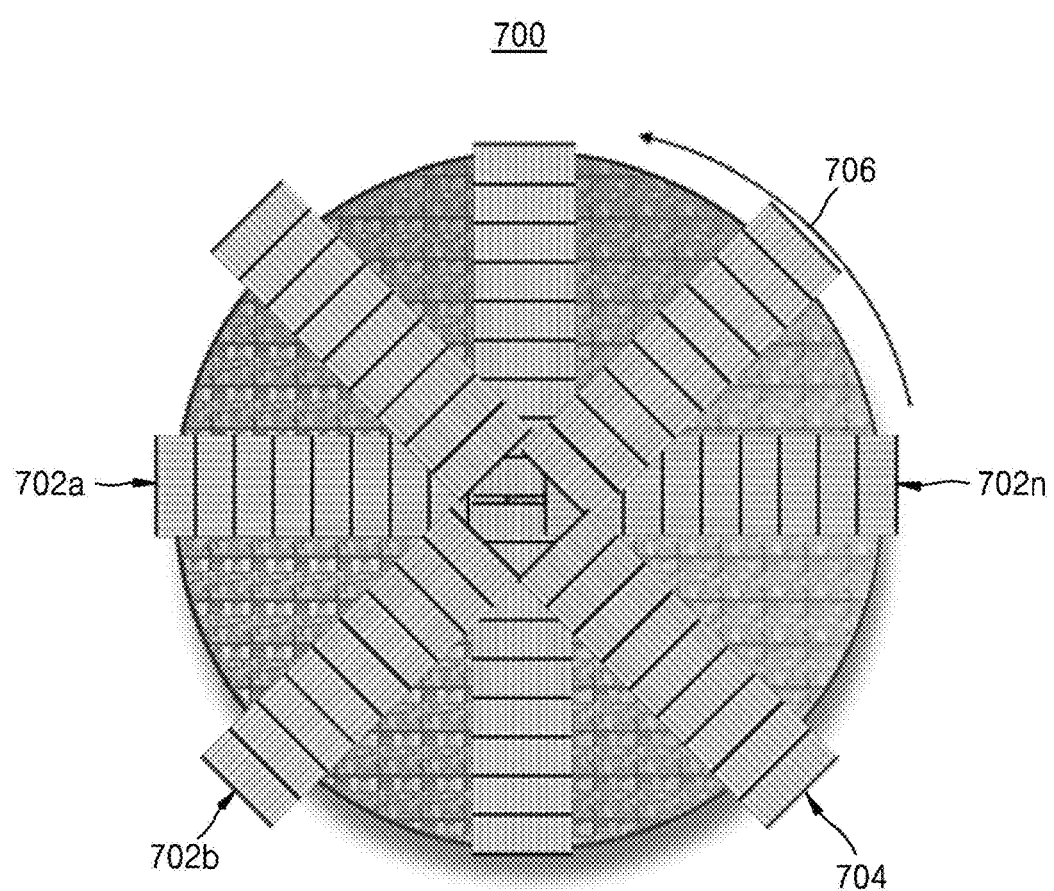
FIG. 7 illustrates a diagram depicting a method for combining images obtained from multiple line cameras, according to an embodiment of the present disclosure.

FIG. 7 illustrates a diagram 700 depicting a method for combining images obtained from multiple line cameras, according to an embodiment of the present disclosure. In an implementation, f the plurality of line cameras 702*a*, 702*b*, . . . 702*n*, where n is an integer, may be arranged in a spoke pattern. The rotating wafer 704 may have an anticlockwise rotation 706 as shown in the FIG. 7. The method may include combining the plurality of images obtained from the plurality of line cameras 702*a*-*n* that are arranged in the spoke pattern to obtain the plurality of the synchronized images. As shown in FIG. 7, a spoke pattern may be created by the combination of the line cameras 702*a*, 702*b*, . . . 702*n* to further reduce the inspection time.

Figure 8A:
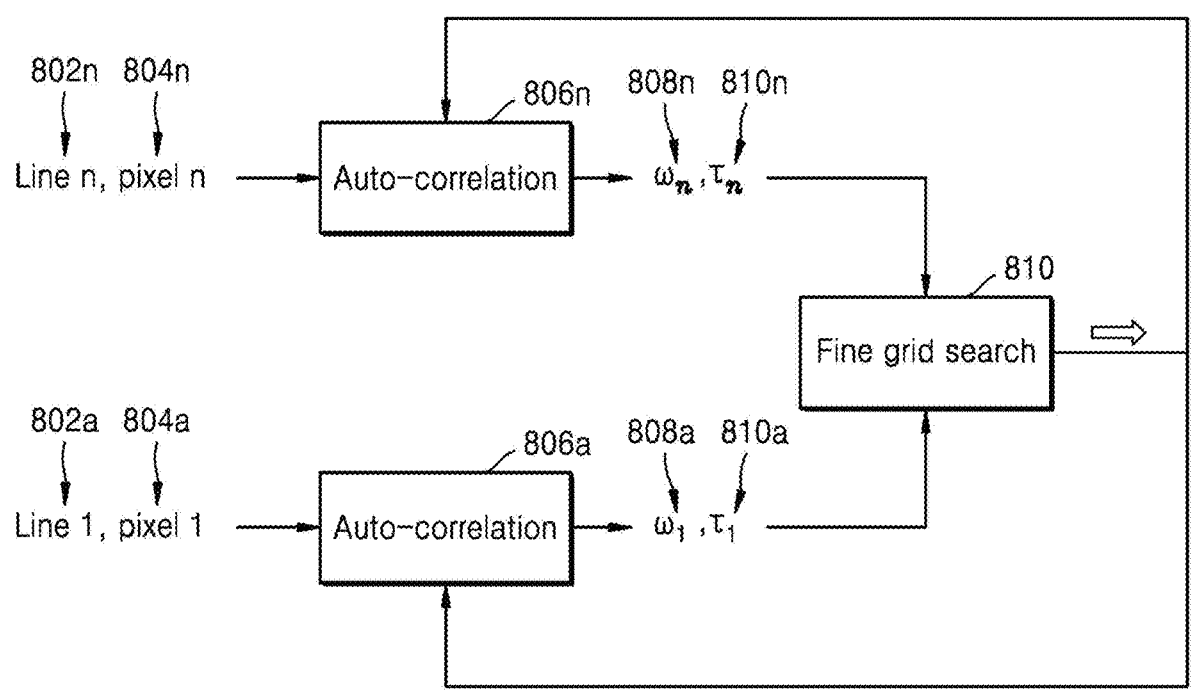
FIGS. 8A and 8B illustrate diagrams depicting a method for synchronization of stage motion, according to an embodiment of the present disclosure.
Figure 8B:
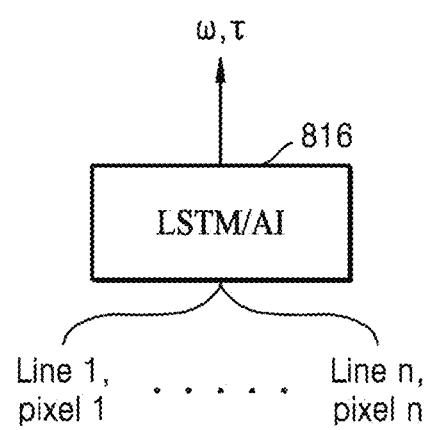

FIG. 8A and 8B illustrate a diagram depicting a method for synchronization of stage motion according to an embodiment of the present disclosure. The method may include determining a time period of rotation of the circular rotating wafer. Here, $\omega\_1$ (808*a*) is the angular rotation speed of the wafer, "line 1" (802*a*) is the signal from a first line camera, "pixel 1" (804*a*) is the signal from a pixel sensor of the first line camera, and $\tau\_1$ (810*a*) is the time period corresponding to $\omega\_1$ (808*a*). Also, $\omega\_n$ (808*n*) is an angular rotation speed of the wafer, "line n" (802*n*) is the signal from an n-th line camera, "pixel n" (804*n*) is the signal from a pixel sensor of the n-th line camera, and $\tau\_n$ is the time period corresponding to $\omega\_n$ (808*n*), wherein "n" is an integer."

As shown in the FIG. 8A, the "line 1" (802*a*), "pixel 1"(804*a*) may be auto correlated (806*a*) by the synchronization module 312 (refer to FIG. 3) to obtain $\omega\_1$ (808*a*), $\tau\_1$ (810*a*). Similarly, the "line n" (802*n*), "pixel n" (804*n*) may be auto correlated (806*n*) by the synchronization module 312 to obtain $\omega\_n$ (808*n*), $\tau\_n$ (810*n*). The differences in the angular rotation speeds thus obtained could be due to error in computation, noise, variation in signal collection rate etc. Hence, the fine grid search 810 may be utilized to obtain more accurate angular rotation speed of the wafer and the corresponding time period. The method may include auto-correlating a plurality of signals (814*a*-814*n*) obtained from respective line cameras, where n is integer, using an artificial recurrent neural network or a long short-term memory (LSTM) 816. The angular speed $\omega 0$ (811) and time period $\tau$ (812) may be obtained from pixel signals (816*a*-816*n*) and fine-tuned using the collection of signals (814*a*-814*n*) from respective line cameras (also referred to as "lines") as shown in the FIG. 8B. Further, blind estimate avoids a requirement for prior knowledge of speed, and may be robust to noise and changes in rotation speed. This not possible with a traditional TDI set up since such setup needs speed information prior to image generation.

Figure 9A:
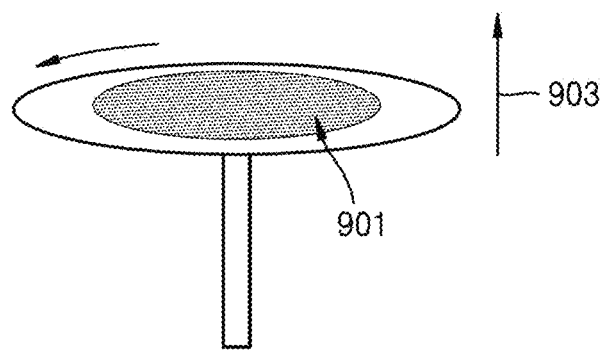
FIGS. 9A and 9B illustrate diagrams depicting a method for obtaining in-focus images, according to an embodiment of the present disclosure.
Figure 9B:
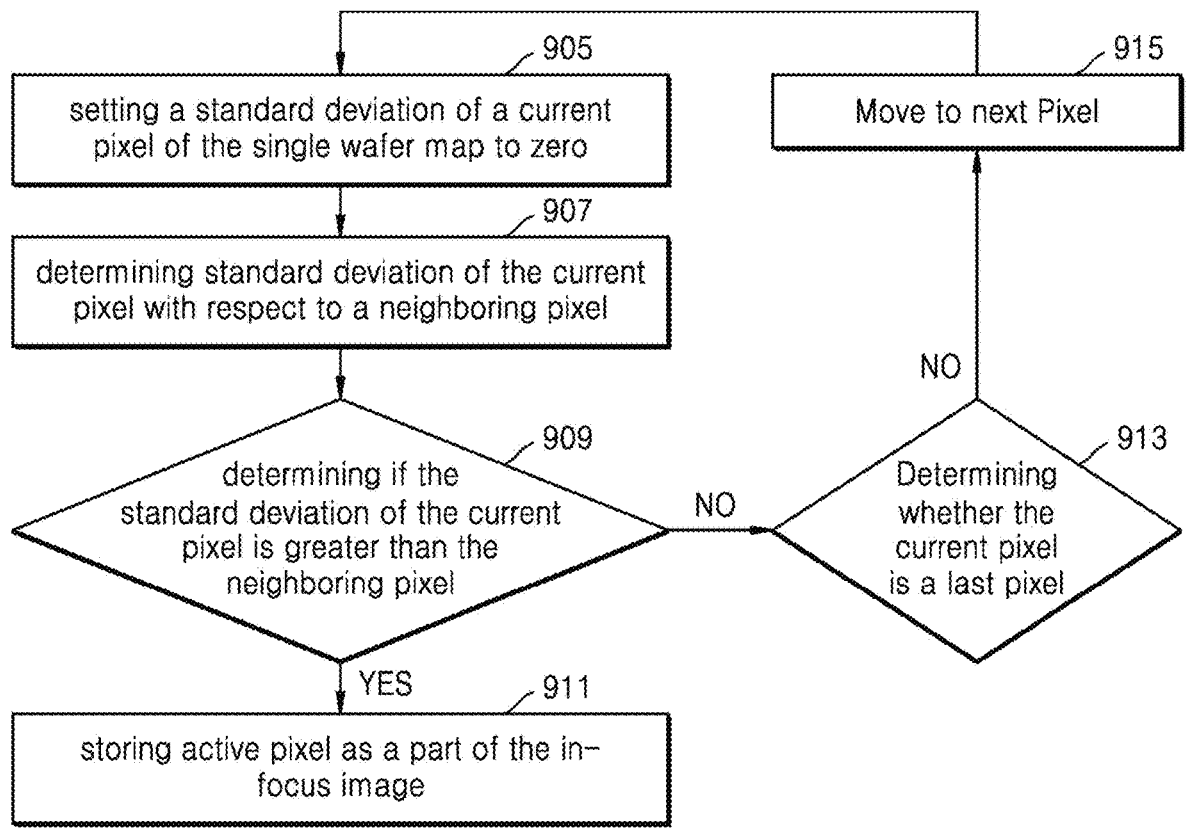

FIGS. 9A and 9B illustrate diagram depicting a method for obtaining in-focus images, according to an embodiment of the present disclosure. FIG. 9A depicts a Z movement 903 during imaging of the circular rotating wafer 901. The circular rotating wafer 901 is rotating in an anticlockwise direction. As a stage with the circular rotating wafer 901 moves in the Z-direction, only the pixel values with highest standard deviation (focus) with respect to neighboring pixels may be saved. The wafer maps from the plurality of line cameras may be obtained for different Z values (e.g., positions of the circular rotating wafer 901 in the Z-direction). With reference to FIG. 9B, for generating the image of a region, only data which has a highest standard deviation i.e., that is in good focus, is added. The method may include obtaining the in-focus image of the single wafer map by (a) setting a standard deviation of a current pixel of the single wafer map to zero at a step 905, (b) determining a standard deviation of a small image section in the neighborhood of the current pixel including the current pixel at a step 907, and (c) determining when the standard deviation is maximum for this image section across images obtained at different Z values at a step 909. The method may include storing an active pixel as a part of the in-focus image based on the standard deviation of a small image section in the neighborhood of the current pixel being maximum a step 911. The method may include, based on the standard deviation of a small image section in the neighborhood of the current pixel being maximum, determining at a step 913 whether the current pixel is a last pixel of the single wafer map. If the current pixel is not the last pixel, the method may include moving, at a step 915, to a next pixel. The method may include repeating the steps 905, 907 and 909 for each pixel of the single wafer map to obtain the in-focus image.

Figure 10A:
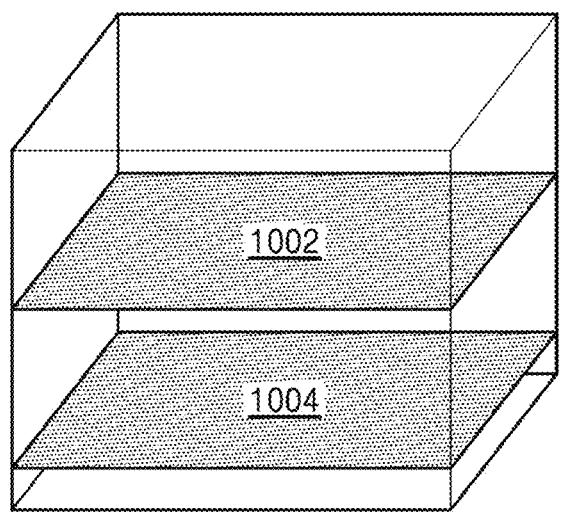
FIGS. 10A and 10B illustrate diagrams depicting a method for auto focusing with a light modulator, according to an embodiment of the present disclosure.
Figure 10B:
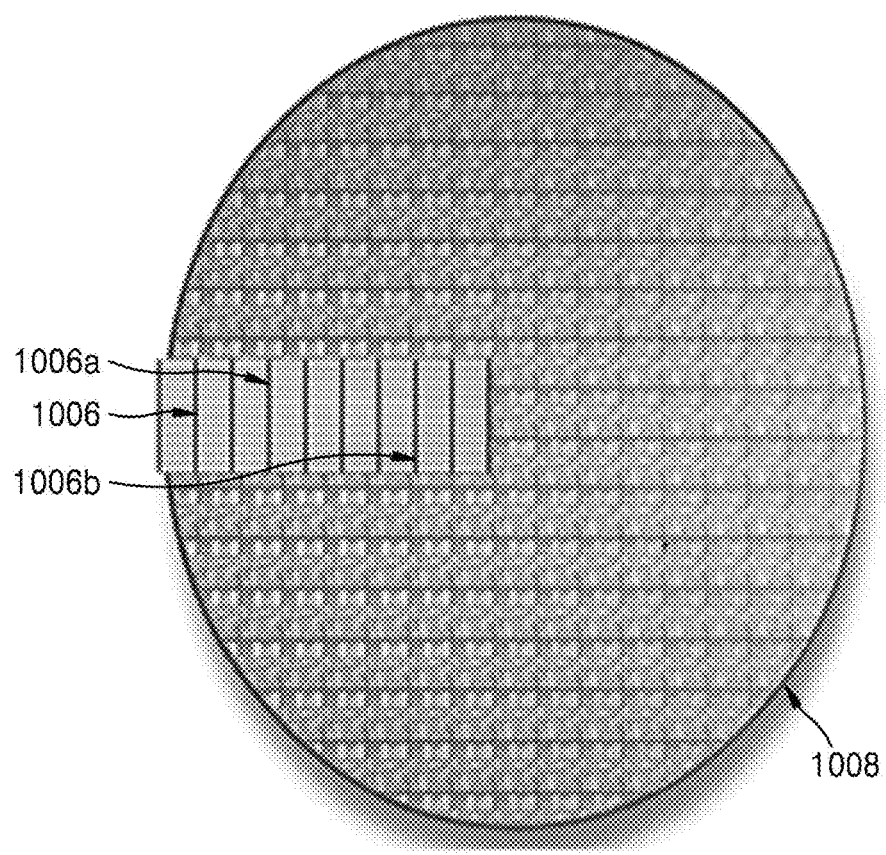

FIGS. 10A and 10B illustrate a diagram depicting a method for auto focusing with a light modulator, according to an embodiment of the present disclosure. The method may include obtaining an active pixel from the array of pixels by using a light modulator. The light modulator includes a 2D micro lens 1002 or a spatial light modulator (SLM) 1006. FIG. 10A depicts the side view of the 2D micro lens 1002 or a spatial light modulator (SLM). The method may include synchronizing the obtained active pixel. The obtained active pixel is time synchronized based on the rotation speed of the wafer 1008, and space synchronized based on the location of the pixel in the array. The method may include obtaining the in-focus image from the synchronized active pixel by activating and deactivating at least a part of the light modulator 1006. Since tangential velocity increases with radius, an image portion of a side of the wafer will be blurred when compared to an image portion of a center of the waver. With activated sensors 1006a and deactivated sensors 1006b for capture as shown in the FIG. 10B, embodiments of the present disclosure may increase the sampling for a higher tangential velocity side of the wafer 1008, thus increasing sharpness of an entire image. Also the wafer 1008 may be have un-even layout coupled with different tangential velocity which will be hard to make focus with a single lens system. However, according to embodiments of the present disclosure, a 2D array of the micro lens 1002 or a transmissive SLM 1004 may be used to correct adverse effects caused by the single lens system.

Figure 11:
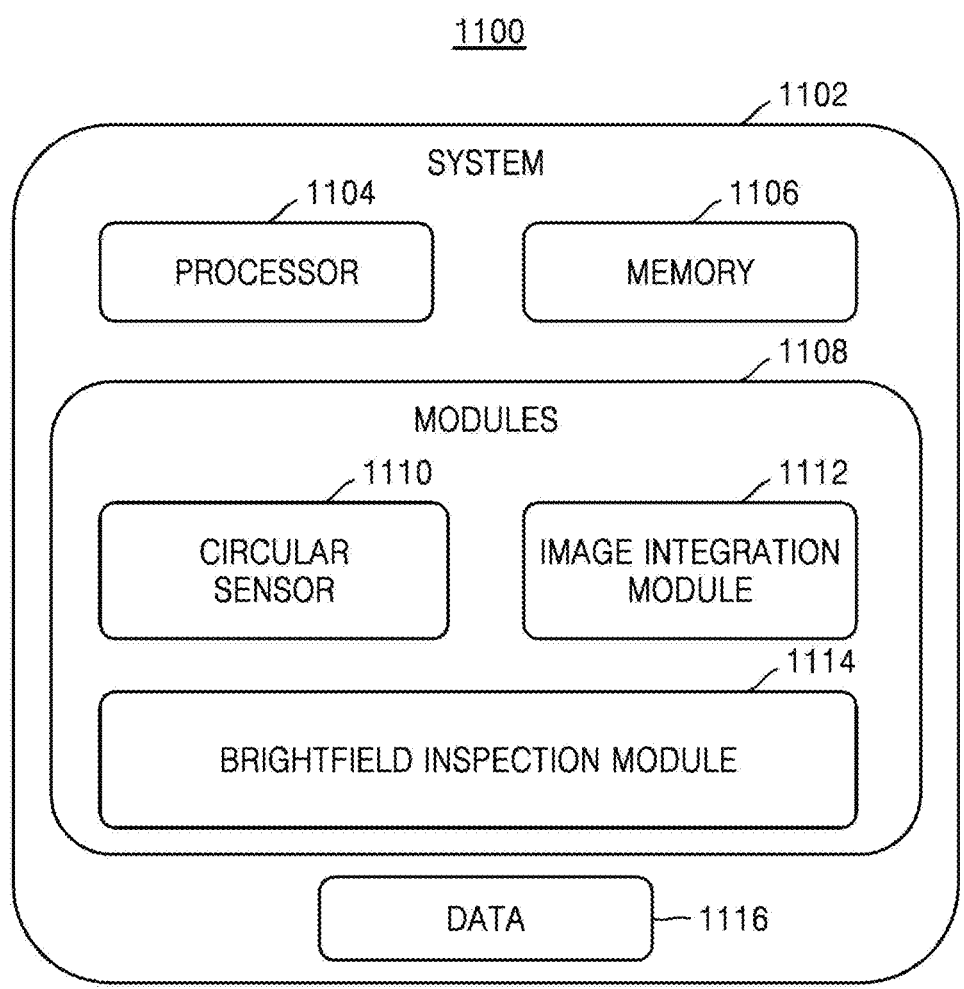
FIG. 11 illustrates a block diagram of a system for brightfield inspection of circular rotating wafers, according to another embodiment of the present disclosure.

In another embodiment, a circular array of sensors may be configured to perform brightfield inspection of circular rotating wafers. FIG. 11 illustrate a block diagram 1100 of a system 1102 for brightfield inspection of a circular rotating wafer, according to another embodiment of the present disclosure. The system 1102 may include a processor 1104, a memory 1106, a circular sensor 1110, an image integration module 1112, a brightfield inspection module 1114 and a data unit 1116. The processor 1104, the memory 1106, the circular sensor 1110, the image integration module 1112, the brightfield inspection module 1114 and the data unit 1116 may be communicatively coupled to one another. At least one of the pluralities of the modules 1108 may be implemented through an AI model. According to embodiments, the AI model (and/or the modules 1108 may be implemented by the AI model) may be stored in memory (e.g., memory 1106) as computer program code and the functions (e.g., one or more of the modules 1108) associated with the AI model may be implemented by the processor 1104 executing the computer program code.

The processor 1104 may include one or a plurality of processors. At this time, one or a plurality of processors may be a general-purpose processor, such as a central processing unit (CPU), an application processor (AP), or the like, a graphics-only processing unit such as a graphics processing unit (GPU), a visual processing unit (VPU), and/or an AI-dedicated processor such as a neural processing unit (NPU).

A plurality of processors (e.g., the processor 1104) controls the processing of the input data in accordance with a predefined operating rule or artificial intelligence (AI) model stored in the non-volatile memory or the volatile memory (e.g., the memory 1106). The predefined operating rule or artificial intelligence model is provided through training or learning. Here, being provided through learning means that, by applying a learning technique to a plurality of learning data, a predefined operating rule or AI model of a desired characteristic is made. The learning may be performed on a device itself in which AI according to an embodiment is performed, and/or may be implemented through a separate server/system. The AI model may comprise or consist of a plurality of neural network layers. Each layer has a plurality of weight values and performs a layer operation through calculation of a previous layer and an operation of a plurality of weights. Examples of neural networks include, but are not limited to, convolutional neural network (CNN), deep neural network (DNN), recurrent neural network (RNN), restricted Boltzmann Machine (RBM), deep belief network (DBN), bidirectional recurrent deep neural network (BRDNN), generative adversarial networks (GAN), and deep Q-networks.

The learning technique is a method for training a predetermined target device (for example, a robot) using a plurality of learning data to cause, allow, or control the target device to make a determination or prediction. Examples of learning techniques include, but are not limited to, supervised learning, unsupervised learning, semi-supervised learning, and reinforcement learning.

As would be appreciated, the system 1102, may be understood as one or more of a hardware, a software, a logic-based program, a configurable hardware, and the like. In an example, the processor 304 may be a single processing unit or a number of units, all of which could include multiple computing units. The processor 1104 may be implemented as one or more microprocessors, microcomputers, microcontrollers, digital signal processors, central processing units, processor cores, multi-core processors, multiprocessors, state machines, logic circuitries, application-specific integrated circuits, field-programmable gate arrays and/or any devices that manipulate signals based on operational instructions. Among other capabilities, the processor 304 may be configured to fetch and/or execute computer-readable instructions and/or data stored in the memory 1106.

In an example, the memory 1106 may include any non-transitory computer-readable medium known in the art including, for example, volatile memory, such as static random-access memory (SRAM) and/or dynamic random-access memory (DRAM), and/or non-volatile memory, such as read-only memory (ROM), erasable programmable ROM (EPROM), flash memory, hard disks, optical disks, and/or magnetic tapes. The memory 1106 may include the data 1116. The memory 1106 serves, amongst other things, as a repository for storing data processed, received, and generated by one or more of the processor 1104, and the modules 1108.

The modules 1108, amongst other things, may include routines, programs, objects, components, data structures, etc., which perform particular tasks or implement data types. The module 1108 may also be implemented as, signal processor(s), state machine(s), logic circuitries, and/or any other device or component that manipulate signals based on operational instructions. Further, the modules 1108 may be implemented in hardware, as instructions executed by at least one processing unit (e.g., processor 1104), or by a combination thereof. The processing unit may be a general-purpose processor that executes instructions to cause the general-purpose processor to perform operations or, the processing unit may be dedicated to performing the required functions. According to embodiments of the present disclosure, the modules 1108 may be machine-readable instructions (software) which, when executed by a processor/processing unit (e.g., the processor 1104), may perform any of the described functionalities. In some example embodiments, the modules 1108 may be machine-readable instructions (software) which, when executed by a processor/processing unit (e.g., the processor 1104), perform any of the described functionalities.

In an embodiment, the circular sensor 1110 may be configured to obtain a plurality of images of the wafer. The circular sensor 1110 may include a plurality of arcs and each arc comprises a plurality of pixel sensors. The obtaining the plurality of images may include obtaining a plurality of intermediary images of at least one part of the wafer by observing the at least one part of the wafer by each of the pixel sensors in each arc. The image integration module 1112 may be configured to obtain a digital image of the wafer based on integrated intermediary images. A brightfield inspection module 1114 may be configured to perform inspection of the wafer based on the obtained digital image of the wafer.

Figure 12:
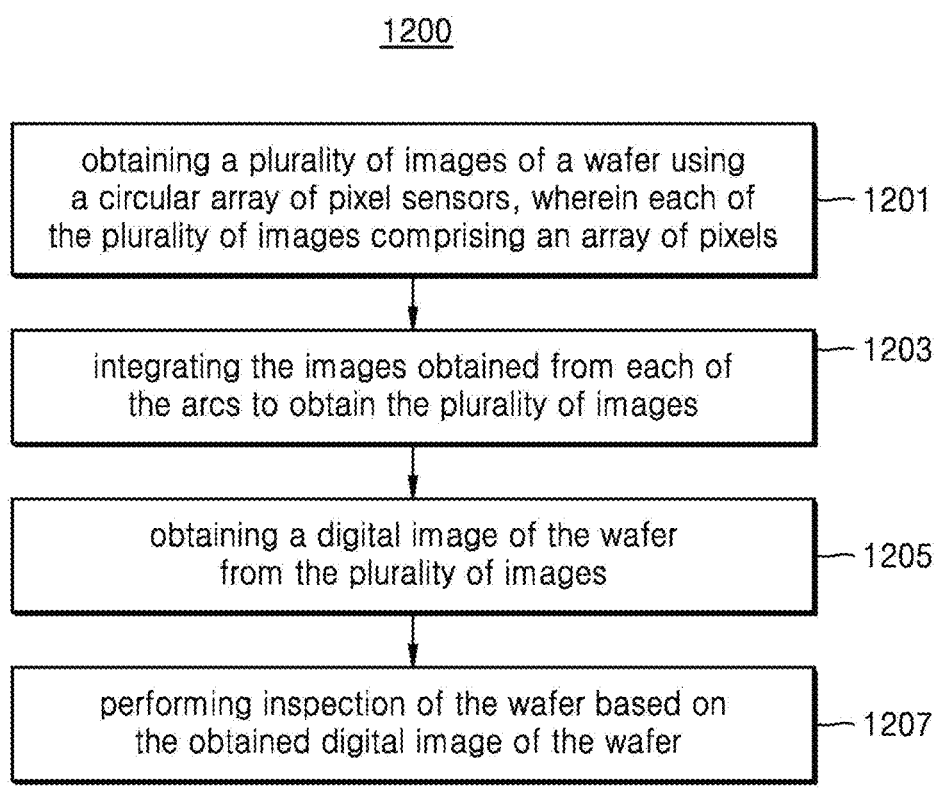
FIG. 12 illustrates a flow diagram depicting a method for brightfield inspection of a circular rotating wafer, according to an embodiment of the present disclosure.

FIG. 12 illustrate a flow diagram 1200 depicting a method for brightfield inspection of a circular rotating wafer, according to another embodiment of the present disclosure. The method 1200 may include obtaining, at a step 1201, a plurality of images of the wafer using a circular sensor. The circular sensor includes a plurality of arcs, and each arc comprises a plurality of pixel sensors. The obtaining the plurality of images may include obtaining a plurality of intermediary images of at least one part of the wafer by observing the at least one part of the wafer by each of the pixel sensors in each arc. Further, each adjacent pixel may be observed at a separate predetermined time. The method 1200 may include integrating, at a step 1203, the images obtained from each of the arcs to obtain the plurality of images. The method 1200 may include obtaining, at a step 1205, a digital image of the wafer from the plurality of images. The method 1200 may include performing, at a step 1207, inspection of the wafer based on the obtained digital image of the wafer.

Figure 13:
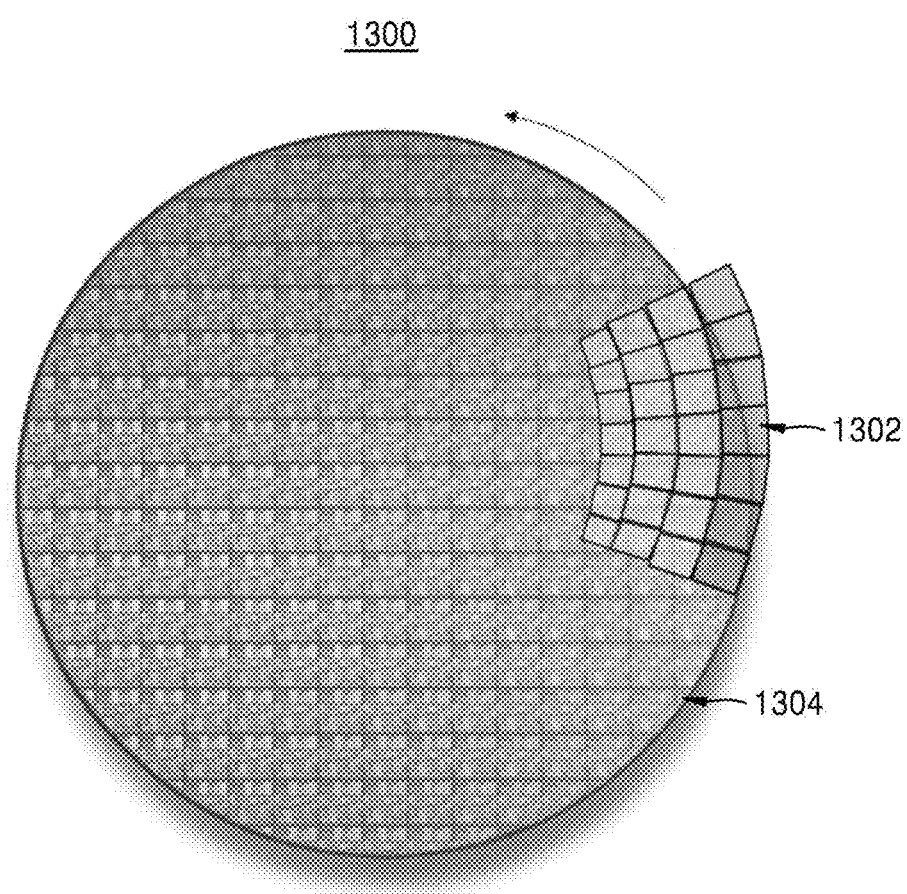
FIG. 13 illustrates a circular rotating wafer with a circular array of sensors, according to an embodiment of the present disclosure.

FIG. 13 represent a circular rotating wafer with a circular array of sensors, according to another embodiment of the present disclosure. In an implementation, the circular sensor 1302 may be configured to obtain a plurality of images of the wafer 1304. The circular sensor 1302 may include a plurality of arcs and each arc may comprise a plurality of pixel sensors. In an embodiment, a plurality of intermediary images of at least one part of the wafer 1304 may be obtained by observing the at least one part of the wafer by each of the pixel sensors in each arc. Thereafter, the plurality of images obtained from each of the arcs may be integrated together to obtain the plurality of images. Thereafter, a digital image of the wafer 1304 may be obtained from the plurality of images and the inspection of the wafer 1304 may be performed based on the digital image.

A simulation overview in accordance with embodiments of the present disclosure is described below. The system to realize all in focus wafer image via objective lens is diffraction limited. If circular shape is assumed for objective lens in that case instrumental point spread function is defined by Airy diffraction pattern (i.e. circular disk shape like diffraction). The Abbe limit hence defines the maximum resolution r, which is obtained using the below Equation 1.

$$r = (1.22\lambda)/2A \qquad \text{(Equation 1)}$$

where $\lambda=550$ nm green light wavelength, and A=numerical aperture size with max value of 1.0 in air medium.

According to embodiments, the resolution may be 0.3 mm/px (300 mm/1000 px). The sampling rate at edge to achieve such resolution may be 360*0.3/2 pi150 mm<0.115. Putting r=0.3 mm in Equation 1, A=1.2 e-3~f/1024. Such a small aperture ensures focus.

It may be noted that increasing scale may require an increase in aperture size and a decrease in rotation step. For example, imaging 300 mm/100000 px may require a rotation step<0.00115 and A~f/16. With an increase in sampling rate, intensity captured at a short interval might be not enough and hence intensity addition using multiple radial CMOS array (SPOKE pattern) can be applied.

Figure 14A:
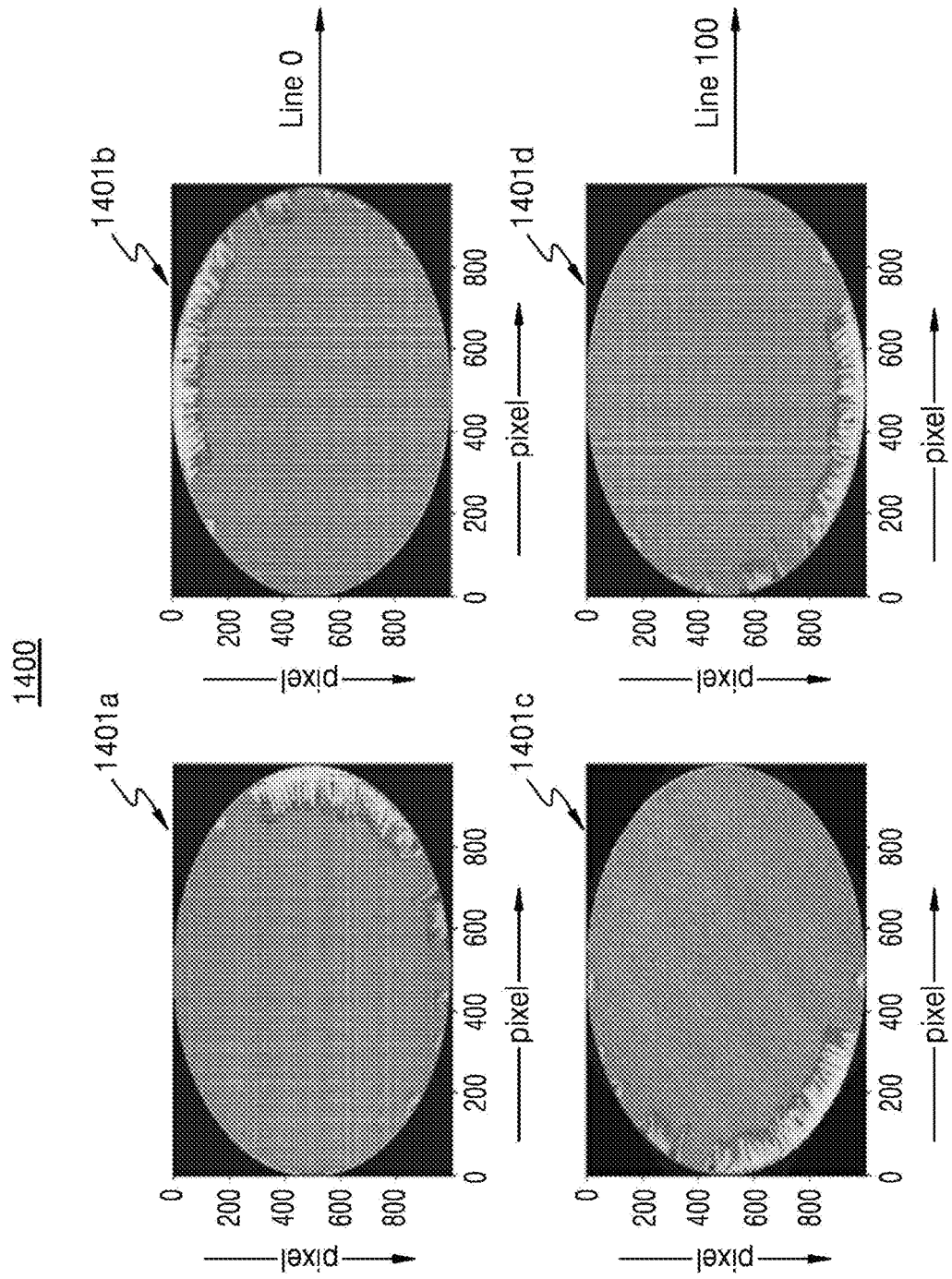
FIGS. 14A and 14B illustrate a simulation overview, according to an embodiment of the present disclosure.
Figure 14B:
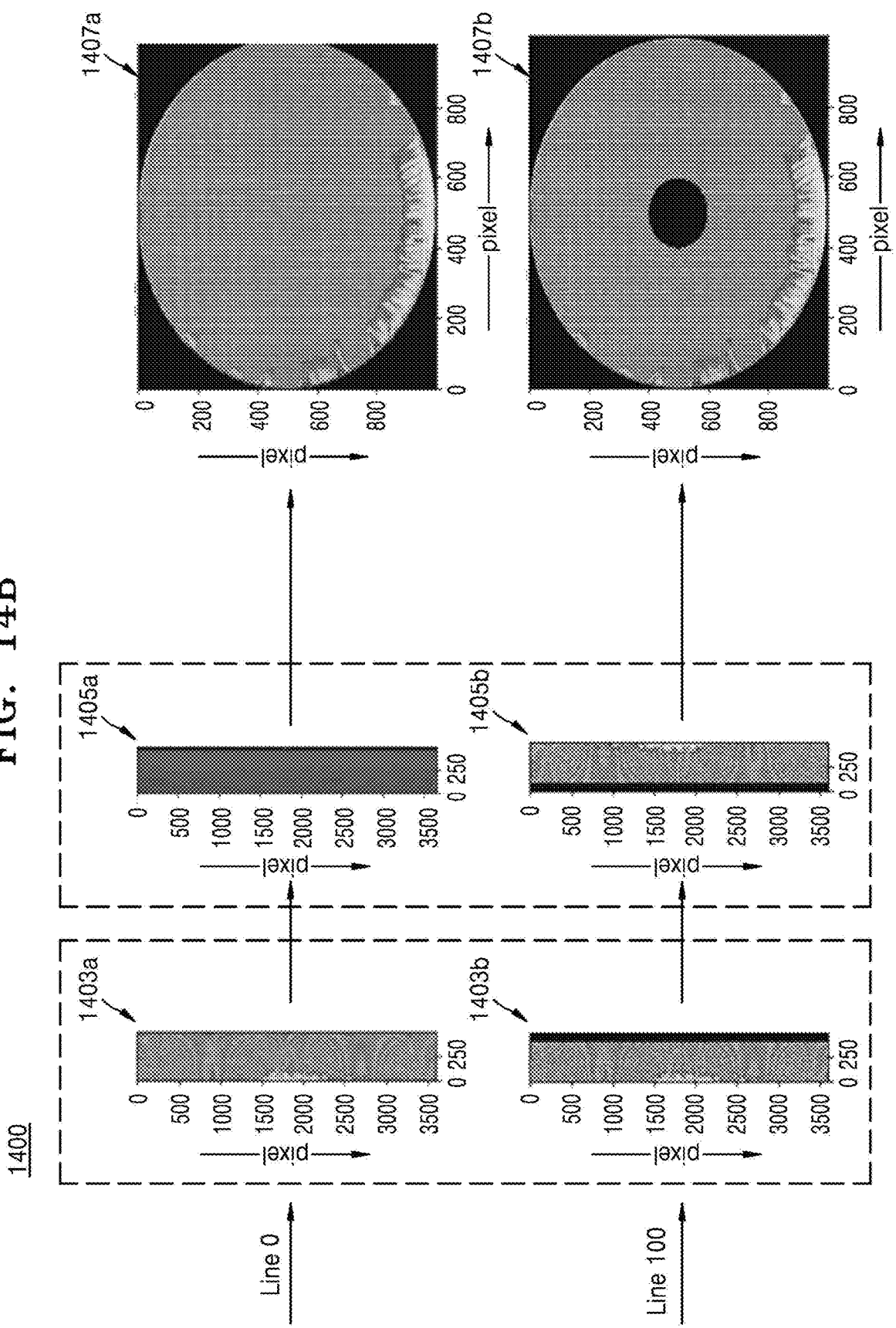

FIGS. 14A and 14B illustrate a diagram 1400 depicting a simulation overview, according to an embodiment of the present disclosure. The simulation overview helps in making defects visible using a method of the present disclosure. As shown in the FIG. 14A, a plurality of line sensors represented as line 0 to line 100 scan the wafer, while the wafer is in rotation of 0.1 degree. Scan images of the line sensors is shown as images 1401a, 1401b, 1401c, and 1401d. The x, y coordinates of the scan images are in pixels. The signals from the line sensors may be time and space synchronized as shown in the FIG. 14B to obtain time and space synchronized images. The time and space synchronize images are depicted as images 1403a and 1403b. The method may include obtaining circular distorted images 1405a and 1405b based on the images 1403a and 1403b, and reconstructing images considering circular distortion of the circular distorted images 1405a and 1405b, such as to obtain reconstructed images 1407a and 1407b. The defect may be identified from the reconstructed images 1407a and 1407b. The reconstructed images 1407a and 1407b may be used to identify defects.

FIGS. 15A to 15F illustrate diagrams depicting a modelling impact of increasing speed of inspection, according to an embodiment of the present disclosure. Stacked line sensor data may be convoluted with 3×3 array with Y value proportional to speed of rotation. TABLE 1 below depicts an example of a distortion array.

TABLE 1

| 0 | Y | 0 |
| 0 | 1 | 0 |
| 0 | 0 | 0 |

Figure 15A:
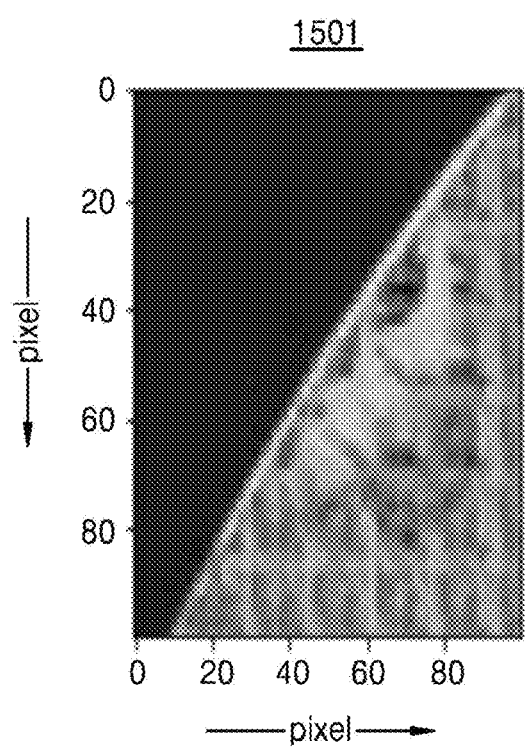
FIGS. 15A to 15F illustrate diagrams depicting a modelling impact of increasing speed of inspection, according to an embodiment of the present disclosure.
Figure 15B:
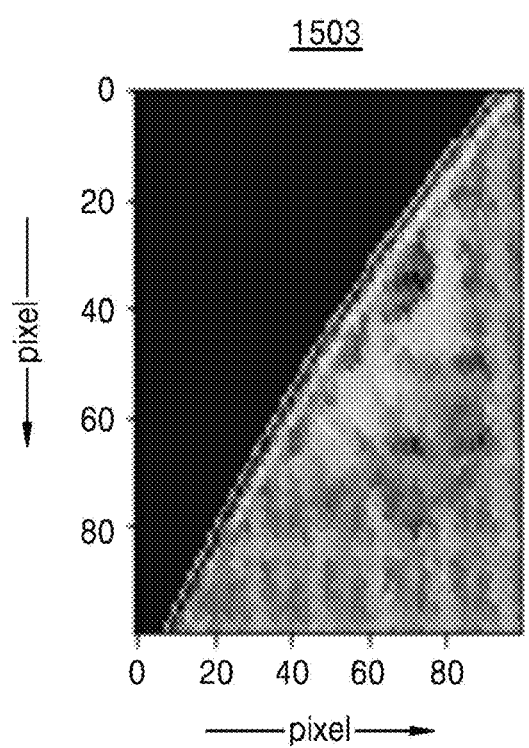
Figure 15C:
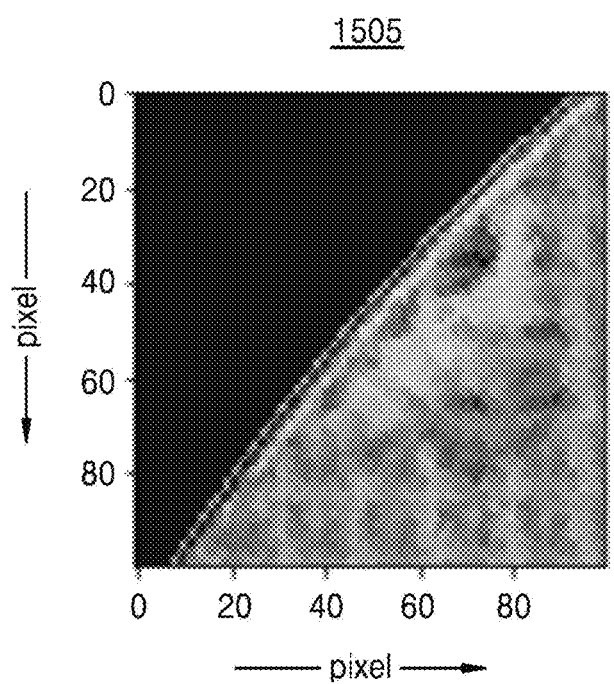
Figure 15D:
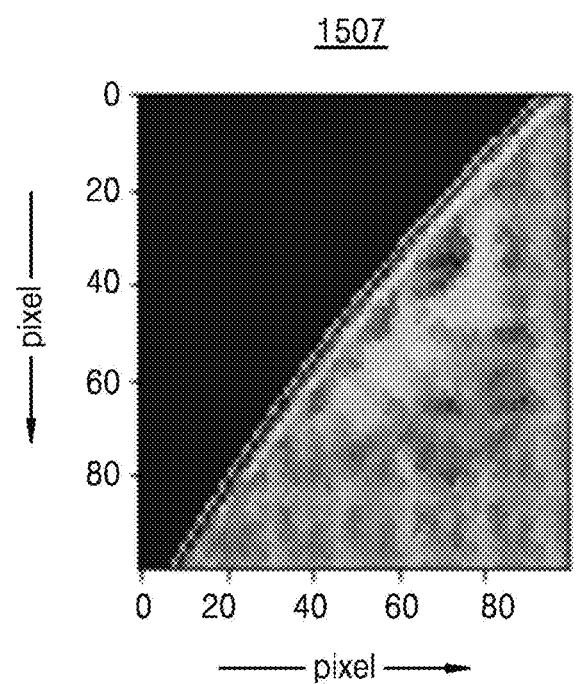
Figure 15E:
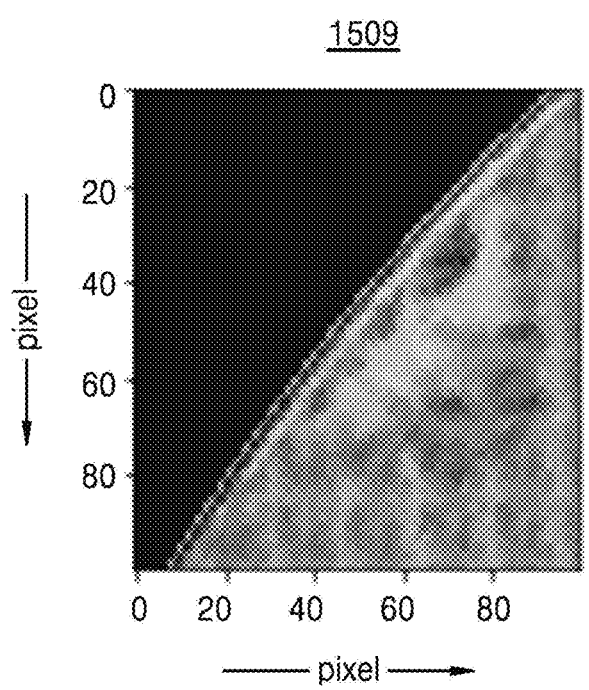

FIG. 15A depicts the actual image 1501, whereas the images 1503, 1505, 1507, 1509, and 1511 represent the images when the value of Y is 0, 0.1, 0.25, 0.5 and 1, respectively, as shown in the FIGS. 15A to 15F. The x, y coordinates of the scan images are in pixels. When Y=0, the neighboring angles may have 0% overlap, which corresponds to the rotation speed R, as depicted in FIG. 15B. In an embodiment, rotating wafer is scanned in circular fashion. Neighboring angles refers to "neighboring pixel" scanned in circular fashion. Further, when Y=0.5, then the neighboring angles may have 50% overlap, which corresponds to the rotation speed of 1.5 R, as depicted in FIG.

Figure 15F:
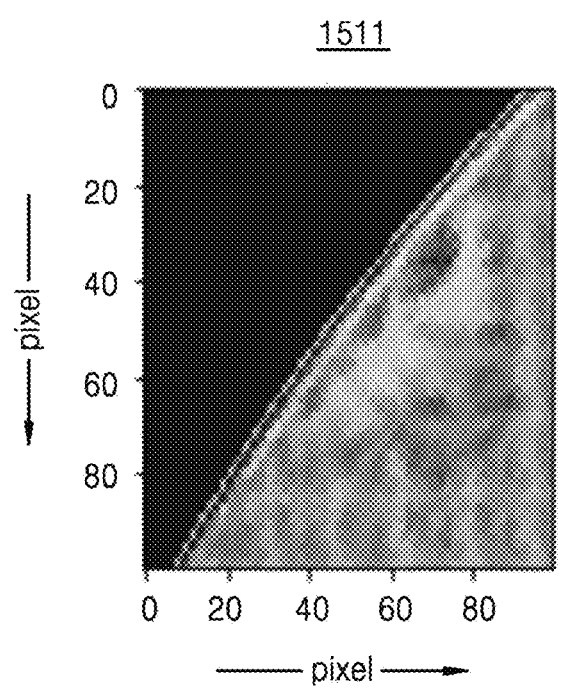

15E. Furthermore, when Y=1, then the neighboring angles may have 100% overlap, which corresponds to rotation speed of 2 R, as depicted in FIG. 15F.

Figure 16A:
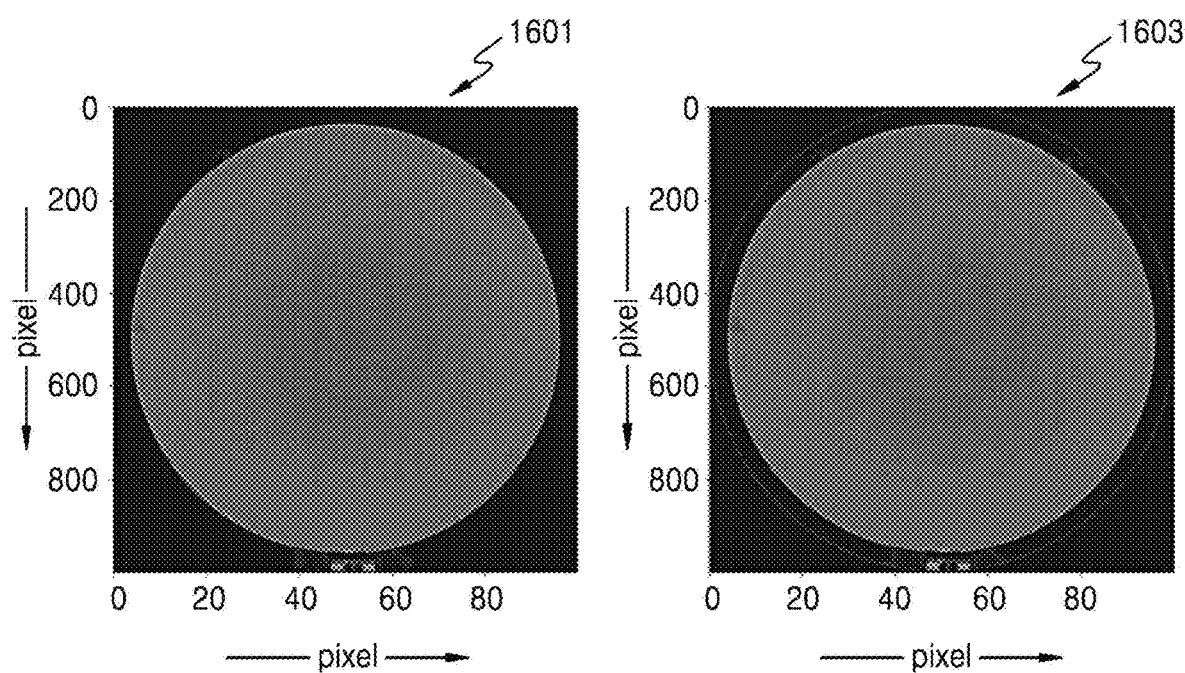
FIGS. 16A to 16C illustrate results of simulation of real wafer images, according to an embodiment of the present disclosure.
Figure 16B:
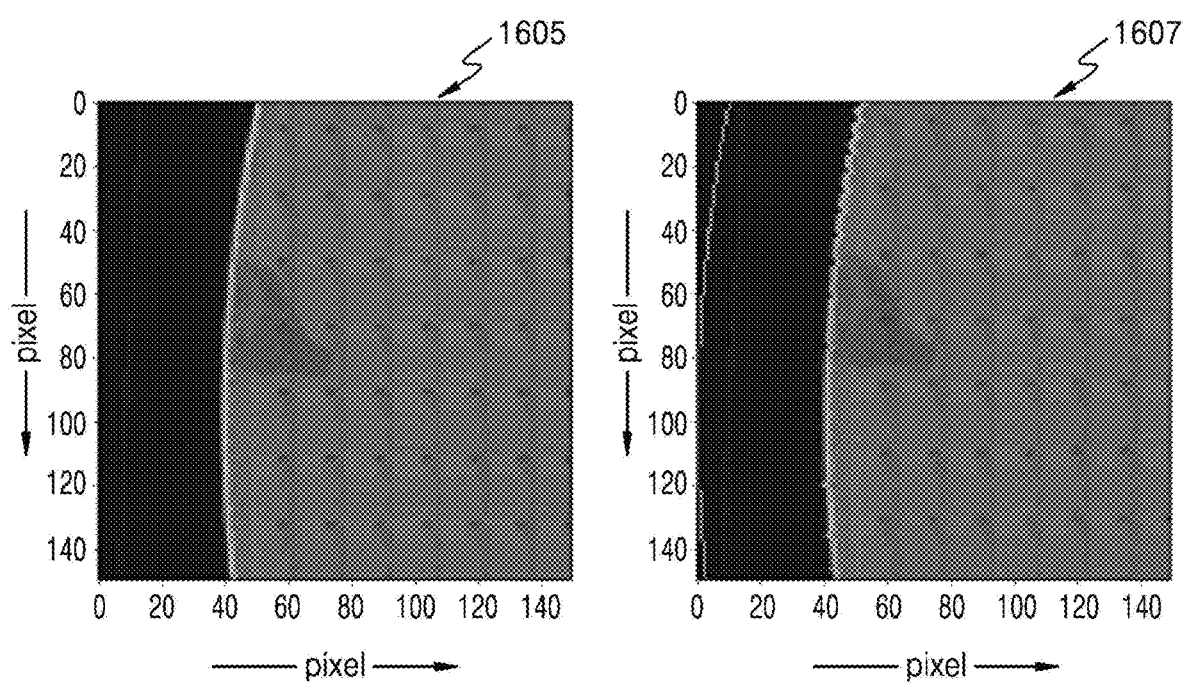
Figure 16C:
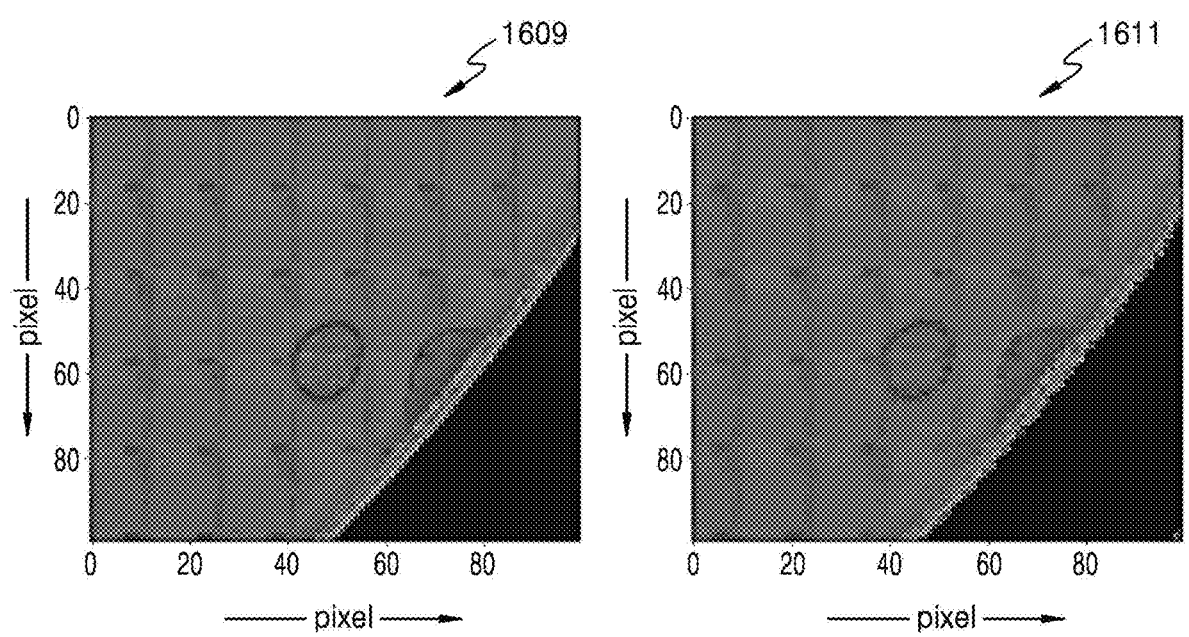
Figure 17A:
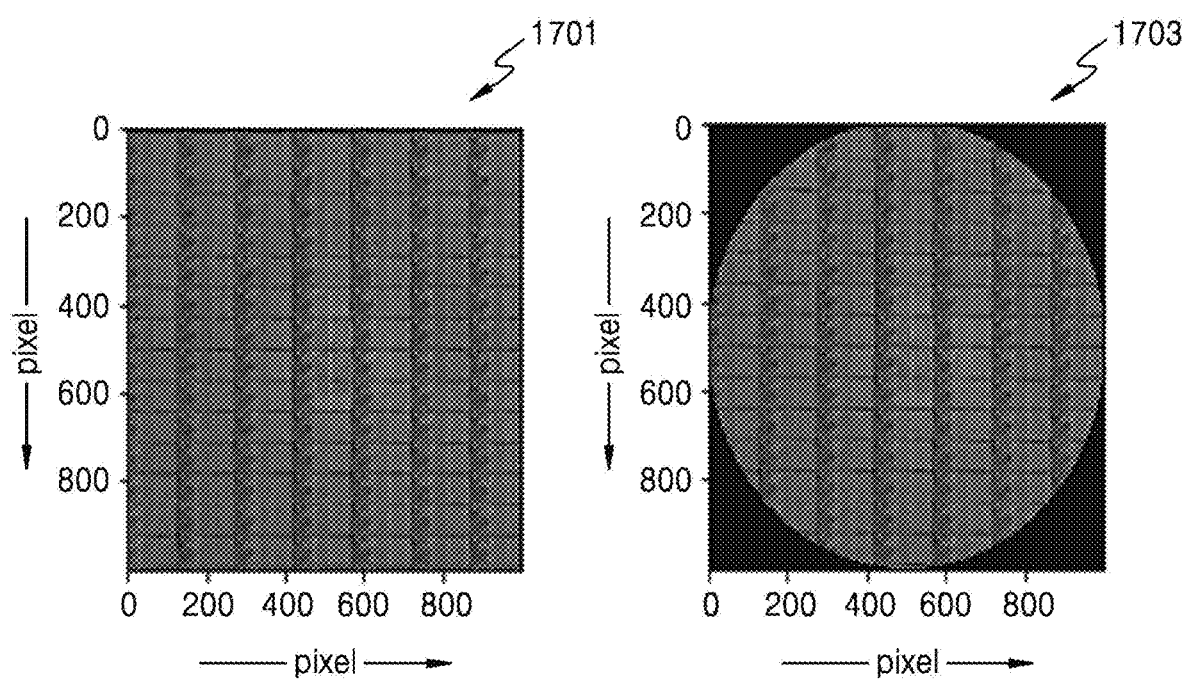
FIGS. 17A to 17F illustrate defect images, according to an embodiment of the present disclosure.
Figure 17B:
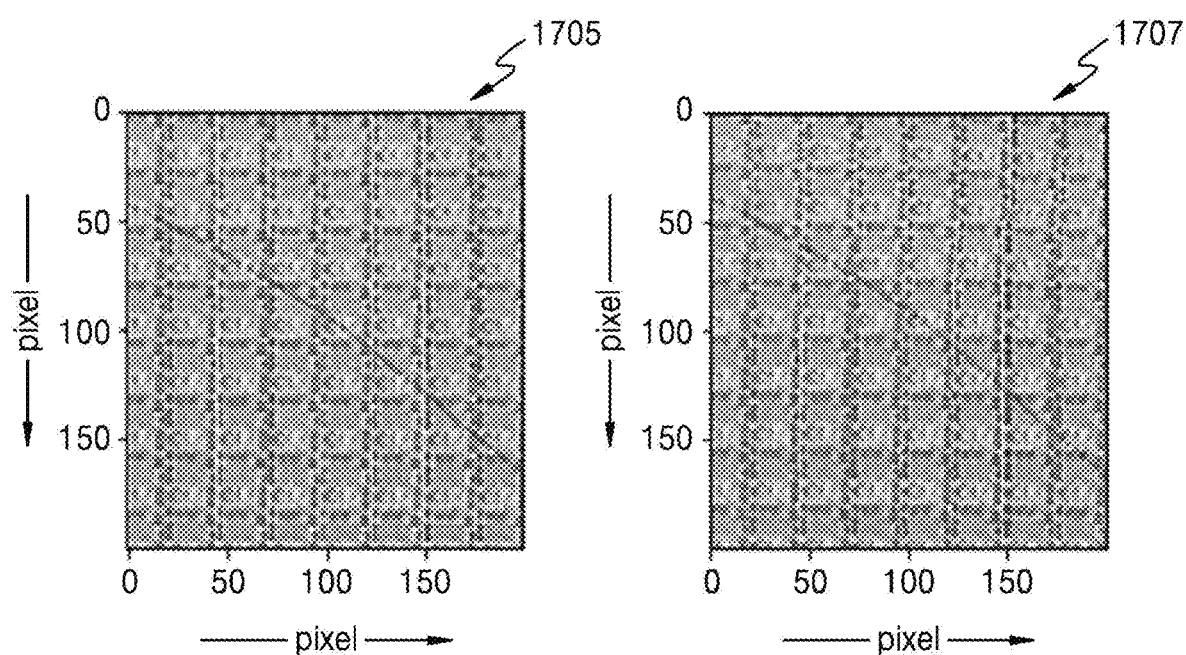
Figure 17C:
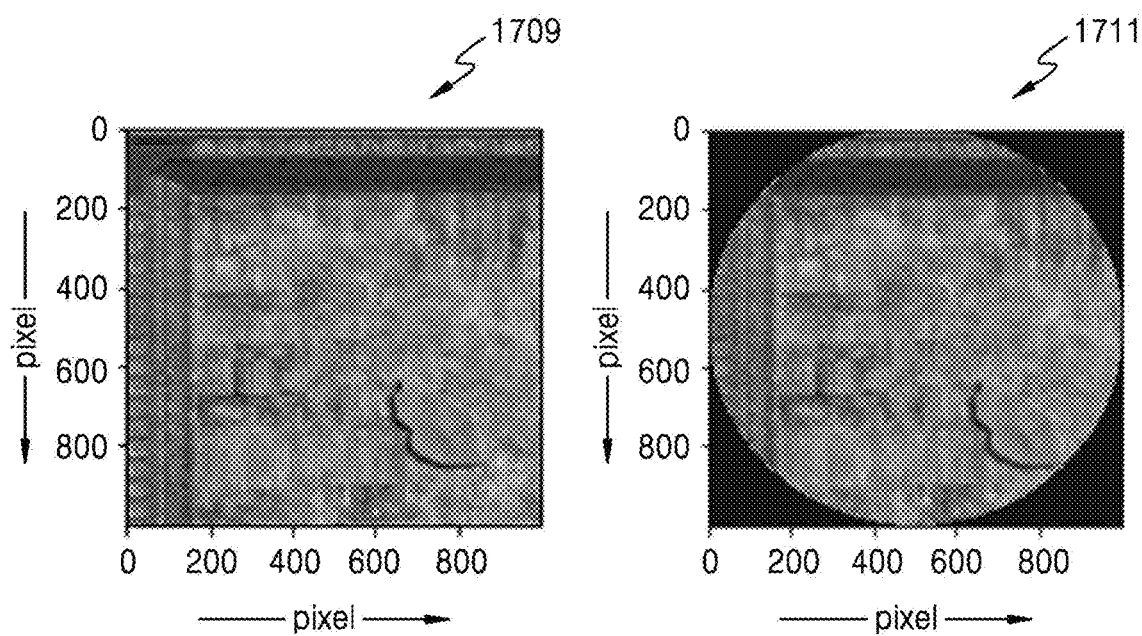
Figure 17D:
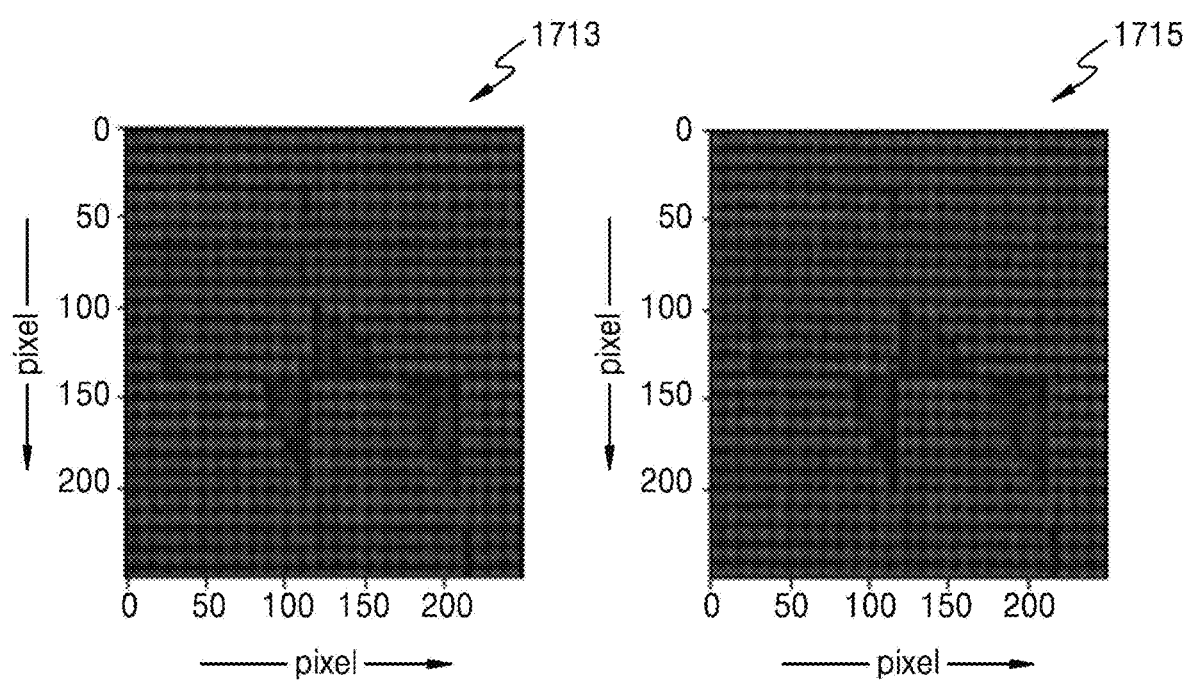
Figure 17E:
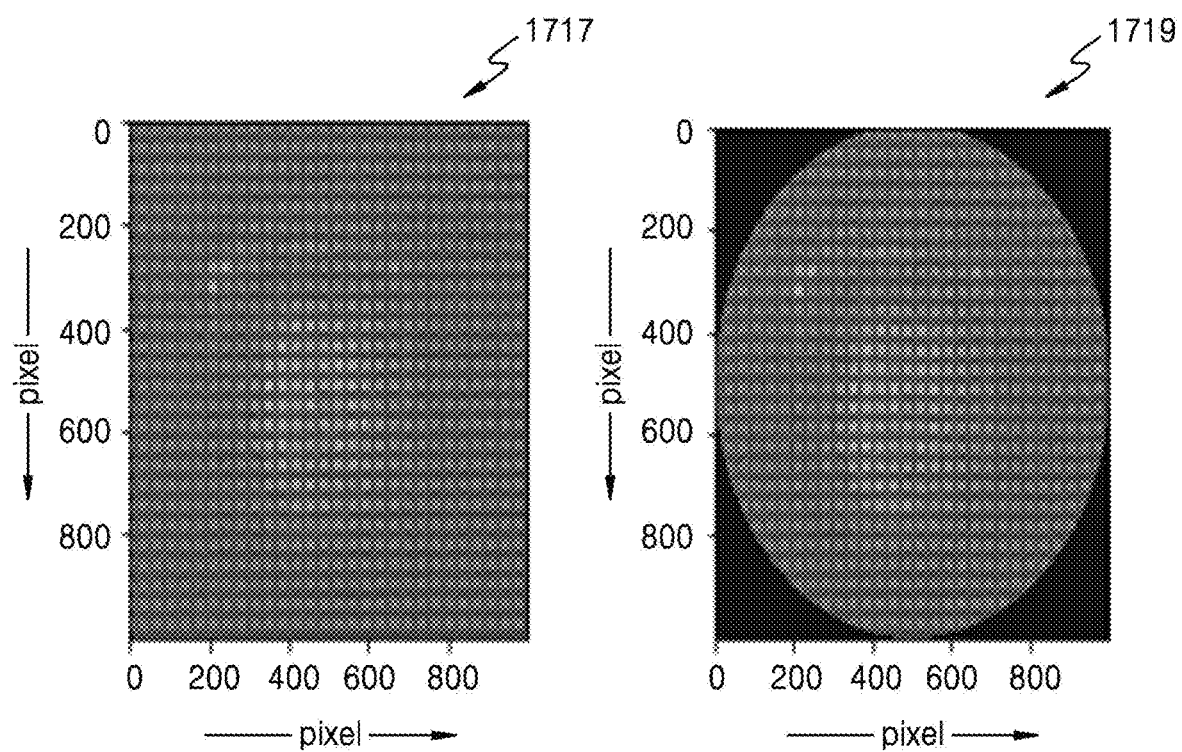
Figure 17F:
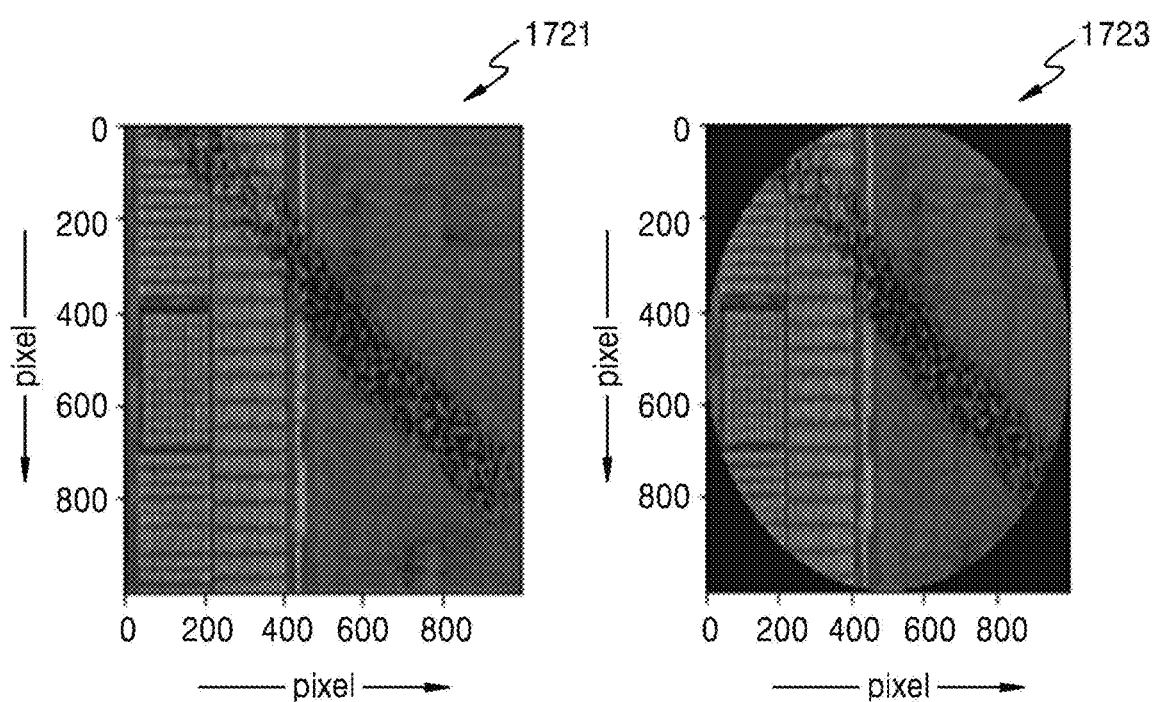

FIGS. 16A to 16c illustrate diagrams depicting a result of simulation of real wafer images, according to an embodiment of the present disclosure. In a simulation, a wafer is in rotation by 0.1 degrees. Considered circular distortion through overlap between adjacent rotation angles. Here images corresponding to each line sensor may be stacked according to the sequence of the wafer rotation. In FIGS. 16A to 16C, the rotation is simulated in steps of 0.1 degree. Thus, for each line sensor, a stack of 3600 rows is obtained in this example. This stack is then synchronized in time and space. Actual impact may be expected to be very small as each image will correspond to ~1e-5 degrees for single sensor configuration. The x, y coordinates of the scan image is in pixels. Ab actual image 1601 and a reconstructed image 1603 is shown in FIG. 16A. Further, defects are easy to identify by comparing the actual image 1605 and 1609 with the reconstructed images 1607 and 1611, respectively, as shown in the FIGS. 16B and 16C.

FIGS. 17A to 17F illustrate diagrams depicting defect images, according to an embodiment of the present disclosure. It may be observed that defects are clearly visible in spite of ~2 R speed. FIGS. 17A to 17F depict simulations for different types of defects by comparing an actual image with a reconstructed image. The x, y coordinates of the scan image is in pixels. The actual image is depicted as image 1701 and the reconstructed image is depicted as image 1703 in FIG. 17A. Similarly, the different type of defects is identified by comparing the actual images 1705, 1709, 1713, 1717, and 1721 with the reconstructed images 1707, 1711, 1715, 1719, and 1723, respectively, as shown in the FIG. 17B to 17F.

In view of the above, embodiments of the present disclosure provide various advantageous features. For example, embodiments of the present disclosure provide a TDI camera with rotation synchronization, wherein such a system has not existed in the background art. Embodiments of the present disclosure provide a circular camera sensor, and such an innovative design may increase sensitivity of inspection for in-situ inspection of a wafer. Embodiments of the present disclosure may provide small sized inspection equipment. For example, an X-Y wafer stage may be replaced by a rotatable chuck to hold and rotate a wafer, which reduced the overall size of the inspection equipment. Embodiments of the present disclosure may provide reduced cost. For example, embodiments of the present disclosure may have fewer moving elements as compared to comparative embodiments, which may reduce ownership costs. Embodiments of the present disclosure may provide reduced inspection time. For example, according to comparative embodiments, it may take about 150 minutes for full inspection of a 300 mm diameter wafer. According to embodiments of the present disclosure, including the methods described herein and placement of n sensors, full inspection may take about 150/n minutes.

While specific language has been used to describe embodiments of the disclosure, any limitations arising on account of the same are not intended. As would be apparent to a person in the art, various working modifications may be made to embodiments of the present disclosure. The drawings and the above description provides non-limiting examples of embodiments of the present disclosure. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein.

Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as an essential feature.

What is claimed:

1. A method for brightfield inspection of a circular wafer that is rotating, the method comprising:
   acquiring a plurality of images of the circular wafer, that is rotating, by using a plurality of line cameras;
   obtaining a plurality of synchronized images, based on the plurality of images, by synchronizing a motion of the circular wafer, that is rotating, with at least one line camera from among the plurality of line cameras;
   obtaining a single wafer map by integrating together the plurality of synchronized images;
   obtaining an in-focus image of the single wafer map while the circular wafer is moving; and
   performing brightfield inspection of the circular wafer based on the in-focus image of the single wafer map,
   wherein the obtaining the in-focus image of the single wafer map comprises:
     repeating the following for each pixel of the single wafer map to obtain the in-focus image:
       setting a value of a standard deviation of a current pixel of the single wafer map to zero;
       determining, as the standard deviation of the current pixel, a standard deviation of pixel values of an image section neighboring the current pixel;
       determining if the standard deviation of the current pixel is greater than a standard deviation of a neighboring pixel, wherein the standard deviation of the neighboring pixel is a standard deviation of pixel values of an image section neighboring the neighboring pixel; and
       storing the current pixel as a part of the in-focus image based on the standard deviation of the current pixel being greater than the standard deviation of the neighboring pixel.

2. The method as claimed in claim 1, wherein each of the plurality of images comprises an array of pixels, and each of the plurality of line cameras comprises pixel sensors.

3. The method as claimed in claim 2, further comprising:
   matching the plurality of line cameras with a wafer curvature of the circular wafer by deactivating a predetermined number of the pixel sensors of the plurality of line cameras; and
   obtaining a plurality of active pixels from each of the plurality of images based on the wafer curvature.

4. The method as claimed in claim 1, wherein the plurality of line cameras are arranged in a spoke pattern, and the method further comprises combining the plurality of images obtained from the plurality of line cameras that are arranged in the spoke pattern to obtain the plurality of the synchronized images.

5. The method as claimed in claim 1, wherein the synchronizing comprises a time synchronization followed by a space synchronization.

6. The method as claimed in claim 1, further comprising determining a time period of rotation of the circular wafer by auto-correlating a plurality of signals obtained from the plurality of line cameras using an artificial recurrent neural network.

7. The method as claimed in claim 1, further comprising:
stacking the plurality of synchronized images; and
converting the stacked plurality of synchronized images into Cartesian coordinates.

8. The method as claimed in claim 2, wherein the obtaining the in-focus image comprises:
obtaining active pixels from the array of pixels by using a light modulator, wherein the light modulator includes a two-dimensional (2D) micro lens or a spatial light modulator (SLM);
synchronizing the obtained active pixels by time synchronizing the obtained active pixels based on a rotation speed of the circular wafer, and space synchronizing the obtained active pixels based on locations of the active pixels in the array; and
obtaining the in-focus image from the synchronized active pixels by activating and deactivating at least a part of the light modulator.

9. A method for brightfield inspection of a circular wafer that is rotating, the method comprising
obtaining a plurality of images of the circular wafer using a circular sensor, wherein the circular sensor includes a plurality of arcs and each of the plurality of arcs includes pixel sensors; wherein the obtaining the plurality of images comprises:
obtaining intermediary images of at least one part of the circular wafer by observing the at least one part of the circular wafer by each of pixel sensors of each of the plurality of arcs;
integrating the intermediary images together to obtain the plurality of images;
obtaining a digital image of the circular wafer based on the plurality of images; and
performing inspection of the circular wafer based on the obtained digital image of the circular wafer.

* * * * *